United States Patent

Crewson et al.

[11] Patent Number: 5,905,646
[45] Date of Patent: May 18, 1999

[54] POWER MODULATOR

[75] Inventors: Walter Frederick John Crewson, Ridgefield, Conn.; Mikael Rolf Lindholm, Enköping, Sweden; David Kerr Woodburn, Caterham, United Kingdom

[73] Assignee: Scanditronix Medical AB, Uppsala, Sweden

[21] Appl. No.: 08/805,149

[22] Filed: Feb. 24, 1997

[30] Foreign Application Priority Data

Dec. 20, 1996 [SE] Sweden ................................ 9604814

[51] Int. Cl.⁶ ............................................. H02M 7/5387
[52] U.S. Cl. ............................ 363/132; 363/16; 363/71
[58] Field of Search ................................. 363/15, 16, 17, 363/20, 21, 24, 25, 26, 40, 41, 65, 71, 97, 98, 131, 132; 336/172, 178, 212; 327/179; 331/87

[56] References Cited

U.S. PATENT DOCUMENTS 3,163,782 12/1964 Ross .
4,682,114 7/1987 Aucouturier et al. ..................... 328/67
5,365,421 11/1994 Eastham .................................... 363/71
5,444,610 8/1995 Gaudreau et al. ......................... 363/54

*Primary Examiner*—Peter S. Wong
*Assistant Examiner*—Y. J. Han
*Attorney, Agent, or Firm*—Young & Thompson

[57] ABSTRACT

The invention relates to a power modulator of pulse transformer type. The pulse transformer includes at least one secondary winding and a number of primary windings. The primary windings share a common ground terminal, but each "hot" terminal is independently connected to a respective dedicated pulse generating module, which includes a pulse switch, such as an IGBT-switch, connected to an energy storage capacitor. The pulse switch is electronically controllable at turn on and turn off, and eliminates the need for Pulse Forming Networks. The electronic pulse switch control is preferably used in combination with pulse voltage droop-compensating circuits that connect the switches to the primary windings. Furthermore, the transformer design is such that each primary winding only surrounds a portion of the total magnetic core cross section, giving an effect of a fractional turn primary.

23 Claims, 14 Drawing Sheets

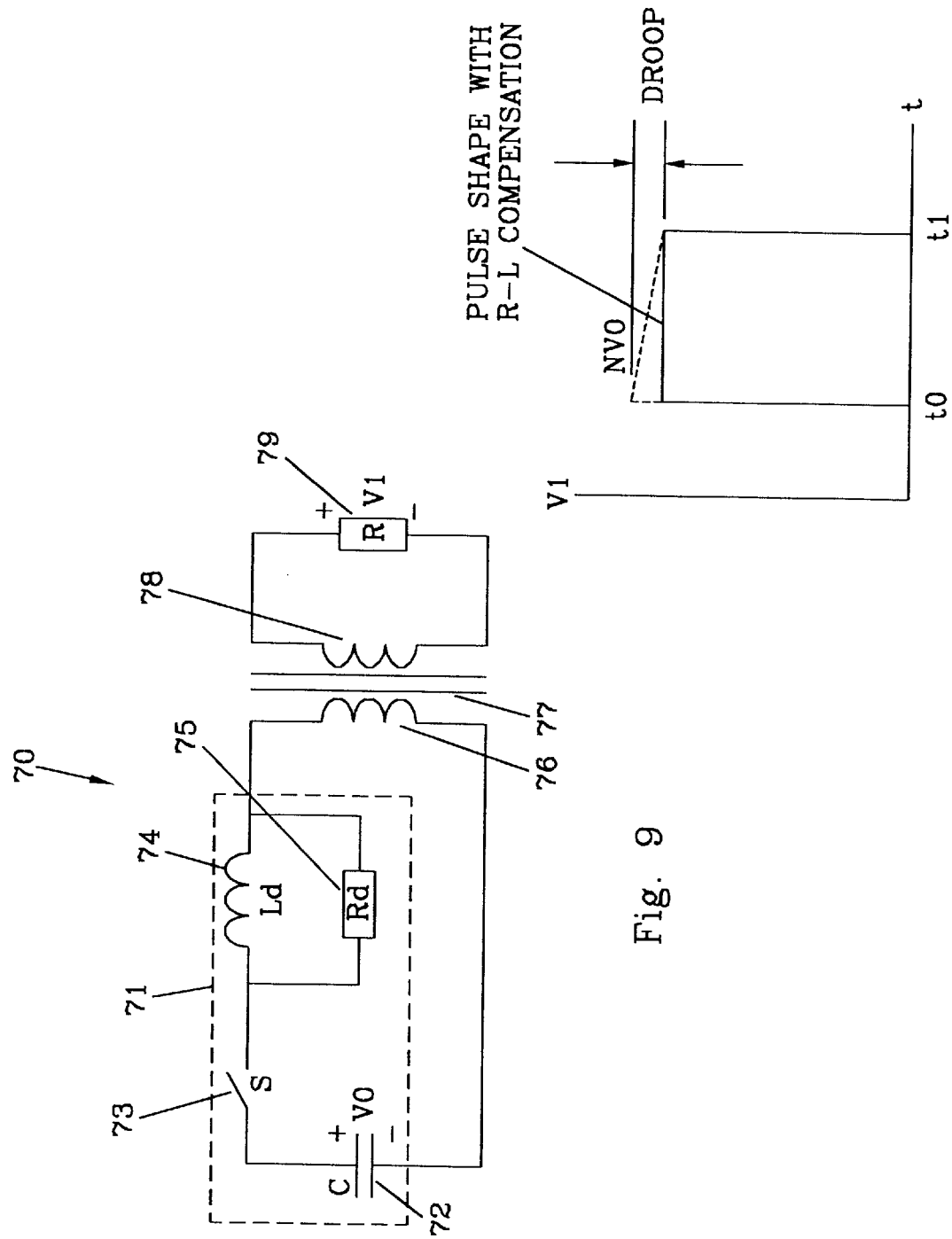

POWER MODULATOR

TECHNICAL FIELD OF THE INVENTION

The present invention generally relates to power systems and more specifically to power modulators, also referred to as pulse modulators.

GENERAL BACKGROUND OF THE INVENTION

High power pulses are used in a wide variety of applications. By way of example, high power electrical pulses are utilized for powering microwave amplifier tubes used in driving electron accelerator systems and/or microwave generating systems for medical radiation-production applications and radar. Of course, several other applications also exist. The quality requirements on the generated pulses are generally high. Pulse energy, pulse width, rise time, fall time and pulse flatness are some of the quality parameters usually under consideration.

Systems or circuits employed for generating these high power pulses are commonly referred to as power modulators or pulse modulators. Most power modulators use pulse transformers to obtain the required pulse energy. However, conventional pulse modulators generally require a huge amount of subsystems and pulse-forming networks (PFN's) to drive the pulse transformer. Consequently, then physical size of these prior art power modulator systems is very large. In addition, the pulse-forming network (PFN) of an old-type power modulator normally operates at high voltage, driven by high voltage capacitors. High voltage always involves great danger. Furthermore, the expected lifetime of conventional power modulator systems using pulse forming networks is generally low.

Conventional Power Modulators Using Pulse Forming Networks

A pulse modulator of the conventional or prior-art type is illustrated in the simplified schematic diagram of FIG. 1. Here, a Pulse-Forming Network 11, comprised of several inductors L and capacitors C connected as shown, is charged rapidly to perhaps 20 kilovolts (typical range for most modulators is 10 to 40 kV) and connected momentarily to the primary winding 13 of a pulse transformer by a high voltage switch 12 (typically a "plasma" or ionized-gas switch such as a hydrogen thyratron tube), delivering half the charging voltage to the pulse transformer (10 kV in the present example). Normally, the transformer is a voltage step-up transformer with a primary winding 13, a transformer core 14 and a secondary winding 15, the turns ratio of the transformer being N:1. The PFN 11 discharges in a traveling-wave manner, with an electrical pulse traveling from the switched end toward the "open circuited" end, reflecting from this open circuit, and returning toward the switched end, extracting energy from the capacitors C as it travels and feeding this energy into the pulse transformer. The energy is delivered to a load resistor 16 connected to the secondary winding 15 of the pulse transformer as a rectangular voltage pulse (FIG. 2), with a fast (microsecond-range) risetime to peak, a relatively "flat" pulse top, and a relatively fast falltime (a fraction of the pulse duration) which occurs when the traveling wave has traversed the PFN structure 11 in both directions and all the stored energy has been extracted from this network.

A Pulse-Forming Network (PFN) is needed to generate a rectangular output pulse, as in all conventional high power modulators dating back to World War II. The Pulse Forming Network (PFN) of a conventional-type modulator must store the entire pulse energy and must be recharged to a high voltage once per pulse. The PFN structure requires high-voltage capacitors and a high voltage switch. This network takes up a large volume, and its components have high electrical and thermal stress applied to them, at high voltage. Furthermore, the PFN structure requires complex "tuning". This combination of requirements makes the design and implementation of a reliable PFN a major challenge.

To generate, by way of example, 140 kV on the transformer secondary, a transformer "turns ratio" (the number of secondary turns divided by the number of primary turns) of 14 is needed in the present example. This is a typical turns ratio for high voltage pulse transformers of the conventional type, which have one primary winding (or sometimes two primary windings connected in parallel) and one secondary winding (or again two secondaries connected in parallel).

There are many drawbacks to the thyratron-switched PFN type of modulator. In several cases, circuit improvements have been worked out over the past five decades since this type of modulator was first developed to reduce the severity of these drawbacks, but none of them has been truly eliminated. The principal problems with PFN type modulators are:

1. The switch used is a hot-cathode vacuum tube, filled at low pressure with hydrogen or deuterium gas. Like all vacuum tubes, this "thyratron" switch tube has limited life, as the hot cathode will eventually "burn out" like a light bulb.

2. The high voltage capacitors in the PFN experience a full charge/discharge cycle during each modulator pulse. They begin each pulse sequence at zero voltage, are rapidly charged to the desired high voltage, are then discharged through the pulse transformer, producing the load pulse, and end the sequence once again at zero voltage. If the modulator runs at typical repetition rates in the 100–1000 pulse-per-second (100–1000 Hertz, or Hz) range, these capacitors are highly stressed by this repetitive charge/discharge procedure and must therefore be quite large (low energy density).

3. All present-day modulators that use either thyratron or SCR (Silicon Controlled Rectifier) switches have a problem if the load develops a fault (short-circuit) during the pulse. These modulators cannot be turned off during the load pulse, and very large fault currents can develop that sometimes damage both the load (microwave tube, electron gun, etc.) and/or the modulator.

4. All thyratron or SCR type modulators require a PFN to create the output pulse shape, as discussed earlier. FIG. 3 is a schematic block diagram which illustrates the overall system structure of a conventional PFN-type of modulator 20. This structure appears in all conventional modulators of the pulse transformer type. The PFN 24 discharges fully during each output pulse and must be fully recharged before another pulse can be created. This requires a specialized power supply called either a "resonant charger" 23 or a "command resonant charger" (one that can be switched on at a specified time). The resonant charger 23, in turn, operates from a large bank of high voltage capacitors 22 which are in turn charged by a high voltage power supply 21. The PFN 24 is connected to a high voltage switch 25 which transfers the extracted energy to a pulse transformer 26 which in turn is connected to a load 27.

As will be explained later on the new modulator according to the invention does in fact eliminate many of the above drawbacks of high voltage modulators.

RELATED ART

U.S. Pat. No. 5,444,610 issued to Gaudreau et al. on Aug. 22, 1995 discloses a high-power modulator. FIG. 4 should help clarify the basic idea of this patent, which is to connect large numbers of low-voltage switches in series to switch high voltages for long-duration pulses, milliseconds to seconds in length. No pulse transformer is used, since for such long pulses, pulse transformers become prohibitively bulky and expensive. The circuits all require the presence of D.C. high voltage power supplies at the same or greater potential as the desired output pulse (since no transformers are used to step up the voltage).

If we were to consider this idea for a 140 kV power modulator 30, we would first need to provide a 150 kV negative DC power supply 31 as shown in FIG. 4, making sure this power supply 31 could deliver 100 ampere pulse currents. The power supply 31 would be very bulky and dangerous (high stored energy). This is 15 megawatt peak power, and the power supply 31 would need significant stored energy to hold its output voltage constant at 100 ampere load, even for 10 microseconds. As an example, to keep the voltage constant to 1 percent, which is 1.4 kV, the power supply 31 would need a capacitive energy store of at least 0.71 microfarads, which stores 8000 joules at 150 kV. One would then need at least 150 pieces of 1200 volt IGBT switches S to serve as a "pull-up" switch 32 to start the pulse at the load 34, plus protective networks (not shown) to save them if one failed to close (else the "open" switch would be exposed to the full 150 kV and fail). One would probably need a second identical assembly of switches S to serve as a "pull-down" switch 33 to remove voltage from the load 34 at the end of the pulse. These would all need to work in unison, and would need to be wired to keep the inductance of the assembly below a few hundred microhenries. In air, the assembly would be at least two meters long. If both the pull-up and pull-down switches 32, 33 accidentally closed simultaneously, 300 IGBTs would fail. Having bought 300 IGBTs, one would need to ensure that the load 34 never sparked over, or the IGBTs would fail due to overcurrent.

U.S. Pat. No. 4,682,114 issued to Aucouturier et al. on Jul. 21, 1987 discloses a power modulator provided with a transformer. The transformer receives a low voltage impulse and transforms it into a high voltage impulse. The primary of the transformer is composed of a plurality of primary windings, all of which are connected in parallel. The primaries are furthermore wound around the secondary and not inside it. The pulse transformer has the secondary winding on the central "leg" of three "legs" of magnetic material (see FIG. 16), and the primary windings surround the secondary.

With this winding arrangement the transformer inductance will be high. The "stray" capacitance will also be large, causing difficulty in achieving a fast risetime. In addition, the circuit shown in the U.S. Pat. No. 4,682,114 is an "old-type" modulator with a separate input power supply, energy storage capacitor bank, resonant charger, Pulse Forming Network (PFN), output switch (of the type that can be turned on electronically but cannot be turned OFF) and pulse transformer. A fact not mentioned in U.S. Pat. No. 4,682,114 is the transformer "reset" problem. In a pulse transformer, the creation of the pulse causes current to flow which persists after the pulse is completed. This current causes a persistent magnetic field in the transformer's magnetic "core", and unless steps are taken to eliminate this field, it will continue to build up over several pulses until the transformer core loses its magnetic properties (it "saturates"). Then the pulse generator must stop, as the transformer will no longer function. This "reset" requirement is particularly hard to handle in transformers with very high turns ratios.

SUMMARY OF THE INVENTION

The present invention overcomes these and other drawbacks of the prior art arrangements.

It is a general object of the present invention to provide a power modulator which is relatively compact in size, while maintaining good output pulse performance.

It is another object of the invention to provide a power modulator which is inherently safer than prior art modulators, and which furthermore has a long expected lifetime.

Yet another object of the invention is to provide a power modulator which eliminates all the high voltage power supplies and high voltage capacitors of old-type modulators, and which accomplishes the pulse modulator function with a minimum of auxiliary systems.

These and other objects are solved by the invention as defined in the accompanying claims.

In accordance with a first aspect of the invention, solid-state switches, such as IGBT-switches, are used in the construction of the inventive power modulator. Synergetic features of the solid-state switches have been utilized in an inventive manner to combine functions in the modulator, thus considerably reducing the modulator volume, compared to conventional modulator circuits.

The IGBT (Insulated-Gate Bipolar Transistor) switch is a solid-state switch of particular interest, since these switches can be turned on and, what is more important, turned off electronically. This is in contrast to thyristor switches conventionally used in power modulators, which can only be turned on electronically. The fact that IGBT-switches are possible to turn off electronically with low-power pulses eliminates the need for pulse forming networks (PFNs) and high voltage capacitors in the modulator. The modulator according to the first aspect of the invention uses low to moderate voltage energy storage capacitors connected to electronically controllable (on/off) switches. Preferably, each capacitor is individually connected to the pulse transformer by a respective switch. The switches transfer energy from the energy storage capacitors to the load through the pulse transformer for a specified time, and are then turned off electronically. This terminates the pulse.

An improvement of the output pulse performance of the inventive power modulator is obtained by using a Pulse Compensating Circuit (PCC), also referred to as a voltage droop-compensating circuit, that connects each solid-state switch to the pulse transformer. In this manner, an almost perfect rectangular pulse will be produced.

According to a second aspect of the invention, in which the pulse transformer comprises a number of primary windings and at least one secondary winding, each primary winding has an independent terminal and a common ground terminal and is separately connected through the independent terminal to an individual one of a number of pulse generating sections. Preferably, each pulse generating section comprises a low to moderate voltage energy storage capacitor directly connected to a pulse switch (advantageously of IGBT-type) which is then connected to the primary winding. This "independent" connection concept assures equal current flow through each switch and corresponding primary winding.

In accordance with yet another aspect of the invention, a transformer design that gives a fractional-turn-primary effect is utilized. In a particular realization example, in which a step-up transformer is utilized, each primary winding is a single turn surrounding only half the total cross-sectional area of the transformer core. With a secondary winding of N turns, a 2×N:1 turns ratio is achieved. It is thus possible to reduce the number of turns on the secondary winding, making the entire transformer physically smaller. This in turn reduces the stray inductance and capacitance of the transformer.

The power modulator according to the invention offers the following advantages:

a compact construction is obtained;

the need for pulse forming networks is eliminated;

high voltage only at the output point of the system, making the power modulator inherently safer than prior art constructions;

long expected lifetime;

small stray losses;

equal current flow in all the primary windings, and hence no overheating of individual primary windings;

high efficiency; and good output pulse quality.

Other advantages offered by the present invention will be appreciated upon reading of the below description of the embodiments of the invention.

BRIEF DESCRIPTION OF THE DRAWINGS

The novel features believed characteristic of the invention are set forth in the appended claims. The invention itself, however, as well as other features and advantages thereof will be best understood by reference to the detailed description of the specific embodiments which follows, when read in conjunction with the accompanying drawings, wherein:

FIG. 9 is a schematic diagram of a modulator structure which includes a voltage droop-compensating circuit according to the invention;

FIG. 10 is a schematic diagram illustrating the pulse shape with voltage droop compensation according to the invention;

DETAILED DESCRIPTION OF EMBODIMENTS OF THE INVENTION

The invention specifically impacts the technical areas of particle accelerators, which includes x-ray, gamma ray and electron or ion beam machines, plus radar system design. Applications for our invention include but are not limited to cancer therapy and medical-instrument sterilization systems, beam injectors for particle accelerators, pulsed electron beam generation for treatment (DeSOx-DeNOx) of boiler flue gas streams, microwave generators for plasma cleaning of semiconductors, ion-implantation systems for semiconductor production, pulsed ultraviolet sources for sterilzation of drinking water and industrial lubricants and pulsed laser drivers for surgical and industrial applications. Anywhere a power modulator is needed, our invention will find application.

Figure 5:
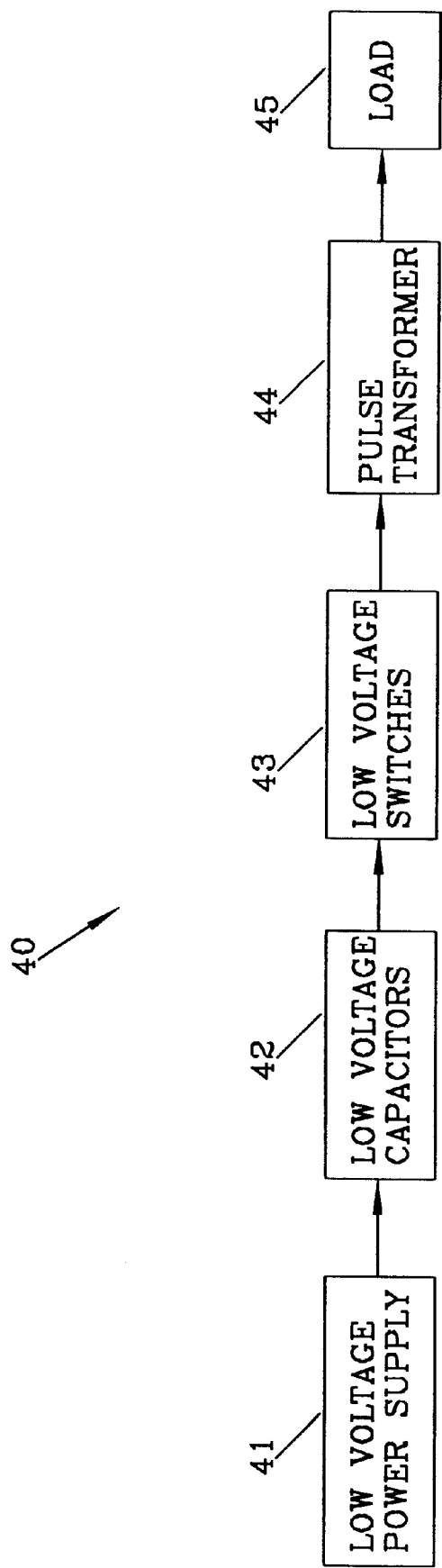
FIG. 5 is a schematic block diagram of a modulator system according to the invention.

A power modulator according to a first aspect of the invention, represented by the block diagram of FIG. 5, eliminates all the high voltage power supplies and high voltage energy stores, and accomplishes the pulse modulator function with a minimum of auxiliary systems. In short, the modulator system 40 according to the invention basically comprises a low to moderate voltage power supply 41, low to moderate voltage energy storage capacitors 42 connected to electronically controllable (at turn on and turn off) switches 43, a pulse transformer 44 and a load 45. It does not store the energy twice as all the "old-technology" modulators do. According to our new modulator concept, we store energy at only one point in the power system, namely in a bank of relatively low voltage capacitors 42 on the primary side of the pulse transformer 44.

Figure 6:
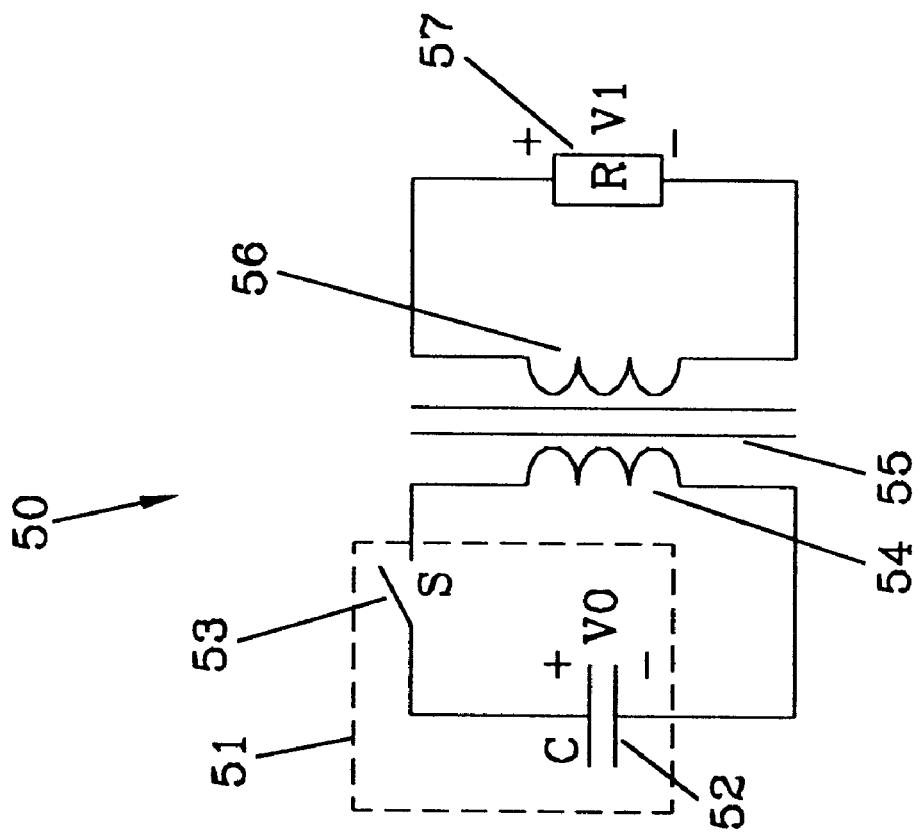
FIG. 6 is a schematic diagram of a modulator structure with an elementary pulse generating circuit according to the invention.

The basic idea, applied to a single capacitor, a single switch and a primary winding, is illustrated in the simplified circuit diagram of FIG. 6. The circuit of FIG. 6 basically comprises a pulse generating section 51, a pulse transformer having a primary winding 54, a transformer core 55 and a secondary winding 56, and a load 57 connected to the secondary winding 56. The pulse generating section 51 drives the primary winding 54 and the transformer steps up the voltage and delivers the energy to the load 57 through the secondary winding 56. The pulse generating section 51 includes a low to moderate voltage capacitor 52 and a pulse switch 53 that is connected to the capacitor 52. The pulse switch 53 is electronically controllable at turn on and turn off. In practice, several pulse generating sections 51 are used to drive the primary side of the transformer. In this case, when a whole bank of capacitors is utilized, each capacitor 52 is individually connected to a respective one of a plurality of primary windings 54 of the pulse transformer by a respective switch 53. The switches 53 transfer energy from the capacitors 52 to the load 57 through the pulse transformer for a specified time, and are then turned off electronically. This terminates the pulse. In other words, the electronically controllable pulse switches 53 are operable to turn on simultaneously to stall the electrical output pulse of the transformer and operable to turn off simultaneously to end the pulse.

Because the switches 53 can be controlled electronically at turn off, no Pulse-Forming Network is needed to turn them off.

The IGBT (Insulated-Gate Bipolar Transistor) switch is the principal switch type of interest to us at present, as this switch can be turned on and, what is more important, turned off electronically with low-power pulses. This is in contrast to thyristor switches, which can only be turned on electronically and must depend on the electrical performance of the associated Pulse-Forming Networks to turn them off. Furthermore, the use of IGBT-switches allows us to turn off the modulator at any time, including during a fault event, reducing the threat of damage to the system. In addition, solid-state switches such as IGBTs have a virtually unlimited service lifetime.

Additional information on IGBT-switches can be found in e.g. Powerex IGBT and Itellimod Applications and Technical Data Book, Powerex, Inc. Youngwood, Pa., USA, 1993.

However, it should be understood that the power modulator circuit according to the first aspect of the invention will work with any type of controlled turn-off switch, including but not limited to MCTs, GTOs, Mosfets, Transistors, etc. Even vacuum tubes could be used if their electrical losses could be made small enough to be practical.

The capacitors in our modulator operate at nearly constant voltage, and so are more lightly stressed than capacitors in a conventional modulator. Since the need for Pulse-Forming Networks (in which the capacitors are fully discharged in a traveling-wave manner) is eliminated with this new concept of using pulse switches that are controllable at both turn on and turn off, our capacitors do not charge and discharge fully while the modulator is running. As a result, our modulator capacitors can be made with higher energy density than conventional modulator capacitors, and our modulator can be much smaller than a conventional one and can give a longer capacitor lifetime as well. The low to moderate voltage energy capacitors are discharged only partially, not fully as in a conventional PFN type of modulator. Preferably, the energy of the capacitors is 10–20 times higher than the output pulse energy, and the capacitors are only discharged to about 90%. Their lost charge is replenished by a power supply between pulses, and the correct capacitor voltage is restored by this power supply prior to the next pulse. No main supply, energy storage reservoir, command resonant charger and voltage regulator subsystems are required. The charging power supply performs the charging and regulating functions. The charging DC power supply for our new modulator is a series-resonant high frequency supply using the same type of IGBT switch that we use in the modulator itself. This provides good commonality of parts, an important factor for efficient manufacturing of a product. The series-resonant inverter is a very useful type of power supply. Its main advantages, which we exploit fully in our modulator, are:

1. This type of power supply is not sensitive to output short-circuits. The only stored energy in the supply resides in the series resonant circuit, so an accidental short-circuit at the output does little or no damage, unlike a high voltage supply for a conventional modulator, which uses high-energy, high-voltage capacitors at its output to store many times the pulse energy of the modulator. Short-circuiting this kind of supply can cause destructive damage.

2. This type of power supply can meet or exceed the requirements of the new European EMC Directive, without the use of bulky powerline filters. It appears to the powerline as a resistive load, to a first approximation, and does not draw the large "spikes" of line current that a conventional transformer/rectifier set does when feeding a high energy capacitor bank.

3. This type of power supply is regulated very easily by "pulse-width modulation", while a conventional supply needs either a combination of a Variac (a large mechanical transformer arrangement) plus a "De-Qing" regulator (which normally involves a thyratron like the conventional modulator itself does, with all those disadvantages), or it needs thyristor input regulation, which adds to the "spikiness" of the already "spiky" input current and further complicates EMC certification. Pulse-width modulation is an efficient method of regulation, as it returns unused energy to the powerline rather than dissipate it as waste heat as older forms of regulators often do (e.g. the "De-Qing" regulator used in conventional modulators).

Figure 7:
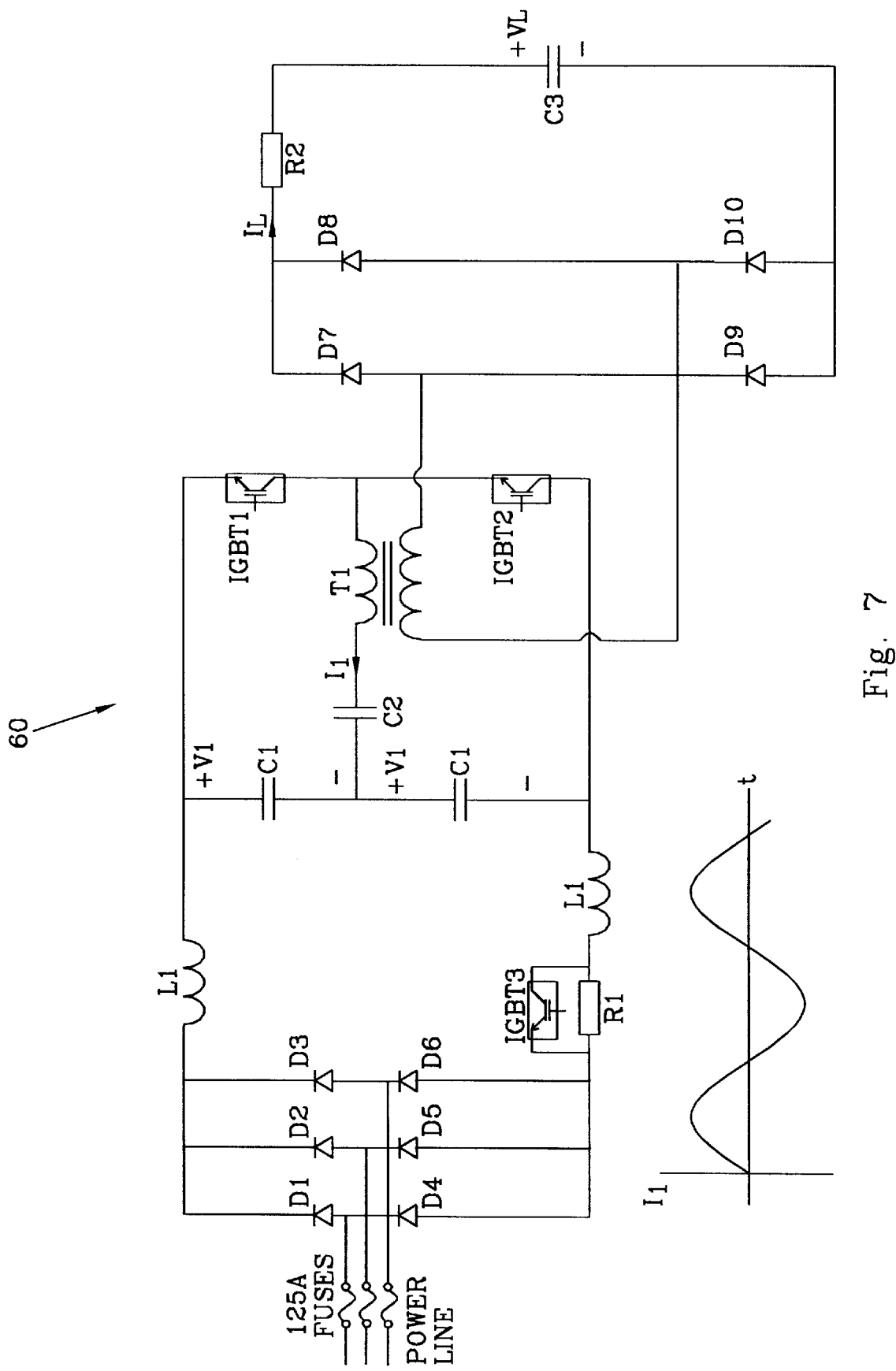
FIG. 7 is a schematic circuit diagram of a series-resonant IGBT inverter power supply according to the invention.

FIG. 7 is a schematic and simplified circuit diagram of a series-resonant power supply according to the invention. First, the reference characters used in FIG. 7 together with component values suitable for a specific realization will be summarized below:

D1–D6=Input rectifiers
R1–12 ohms, 30 watts=Soft start resistor
L1=Choke to reduce 10 kHz currents on the power line
C1=66 $\mu$F, 1100V Capacitor
C2=10 $\mu$F, 600V Resonance Capacitor
T1=5:1 Step-up Transformer, Ferrite-Core, 10 kHz, 25 $\mu$H Primary Side Leakage Inductance
D7–D10=Fast Recovery Output Rectifiers, 1600V, 85A
C3=36 Modules, 66 $\mu$F each (2376 $\mu$F total)
IL=Load Current, 50A Max
VL=Load Voltage, 1 kV Max
R2=Module Charging Resistance, 5$\Omega$ per module, 36 total, 5/36=0.139 ohm total.

The series-resonant power supply 60 works as follows: Switch number 1 closes (in our case an IGBT, referred to as IGBT1). This causes the resonant circuit formed by L1 and C1 to conduct current. The current waveform is a sinusoid, with frequency given by:

$$f = \frac{1}{2\pi\sqrt{L_1 C_1}}$$

Positive current flow $I_1$ is indicated by the arrow in FIG. 7. Before this sinusoid completes its first half-cycle, IGBT switch 1 opens. The current still flowing in the resonant circuit now transfers to the diode connected across IGBT switch 2. This action reverses the voltage on the resonant circuit, helping to force the current to zero. When the current reaches zero, or slightly before this time, IGBT switch 2 closes and the process repeats for the second half-cycle. This time, current flow is against the arrow direction (current is negative). The current waveform is sinusoidal.

If the current has peak amplitude I amperes, the charge Q transferred through the resonant circuit in one half-cycle is simply the area under the current waveform. The duration of this half-cycle is t=½f, and the area is easily shown to be:

$$Q = \frac{1}{\pi f}$$

The driving voltage impressed on the resonant circuit during the first half-cycle is Vo/2. Therefore, the energy delivered to the resonant circuit in this time is W=QVo/2, and the average power delivered during the first half-cycle is P=W/t=QVof=IVo/$\pi$=0.318IVo.

This energy does not remain trapped inside the resonant circuit. The transformer T1 and rectifier circuit D7–D10 shown in FIG. 7 act to connect the load R2 in series with the resonant circuit, and the energy is transferred through the resonant circuit to the load R2, where it is used as the output power for the modulator. Each half-cycle of the circuit operation is the same as each subsequent half-cycle, so the power calculated above is the long-term average power carried from the powerline through the power supply and delivered to the load.

In a specific realization of our modulator, Vo is the rectified peak line voltage of a 400-volt three phase input powerline, or 566 volts. If the power transferred through the resonant supply to the load is to be 50 kilowatts, then the above simple calculations show that the peak current in the resonant circuit will be 278 amperes, and the RMS value of this sinusoidal current must then be 197 amperes. These currents and voltages are easily handled by our 1200 volt, 600 ampere IGBT switches.

In summary, the series-resonant power supply is a "charge pump", picking up electric charge from the powerline, storing it momentarily in the resonant circuit, and depositing it in the load, then repeating the process on the next half-cycle of the resonant circuit operation. At any instant, the energy stored inside the supply and available to deliver to the load is just the energy stored in the resonant circuit. In our modulator, if the output power is 50 kW and the power supply operates at 10 kHz, then the size of a "packet" of energy passing through the power supply is simply 50 kW divided by the number of "packets" or half-cycles per second. At 10 kHz, we have 20,000 such "packets" passing through the power supply each second, so each packet must store about 5/2=2.5 joules. In contrast, consider a "conventional" power supply, which requires an output filter capacitor to reduce the "ripple" generated by the input powerline. A 50 kW conventional power supply might require an output ripple (variation in the voltage with time) of one percent, and might operate at 10 kV for example. To maintain this degree of ripple, with a 50-Hz, 3-phase power line input, approximately 8400 joules would need to be stored in an output filter capacitor. This energy is immediately available to be delivered to an accidental short-circuit, and is about 5000 times larger than the energy available from the series-resonant supply. This relative immunity from damaging or deadly consequences of a short-circuit is one of the principal advantages of the high-frequency series-resonant power supply.

This power supply can be controlled (regulated) by adjusting the "on" time of the switches. As this time becomes shorter than a half-period of the resonant (LC circuit) frequency, the resonant circuit carries proportionally less energy to the load. Energy is only transported to the load during the switch "on" time, when both the voltage and current flow are in the same directions (both positive or both negative, either case giving positive power flow towards the load). If the switch that is closed (only one switch is closed at a given time) is opened before the resonant current has stopped flowing, the current immediately transfers to the diode connected across the other (non-active) switch. This reverses the polarity of the voltage applied to the resonant circuit but not the polarity of the current flow, and since power is voltage times current, if the algebraic sign of either voltage or current reverses, the direction of power flow reverses also. Any energy left in the resonant circuit when the switch opens is thus returned from the resonant circuit to the input powerline. It is not dissipated, as it would be in a conventional "De-Qing" regulator, which stops energy flow into a modulator when the desired voltage has been reached and discards the unused energy as waste heat. This is another major advantage of the series-resonant power supply. It is quite efficient, as its regulation scheme does not waste energy. Efficiencies of 95 percent are often achieved with this kind of power supply.

Due to the elimination of subsystems, which in turn is based on the cooperative features of the solid-state switches, our modulator can be built very compactly, with approximately 10% of the volume of the "old-technology" systems. A practical realization of our design, built for powering a particle accelerator and now in operation, has a total volume of approximately 0.8 cubic meters, while a modulator of the conventional type used to power an earlier cancer treatment accelerator with the same output characteristics is about nine times larger. The relative compactness of our new modulator system makes possible many new applications for this kind of technology that were previously not feasible due to system size and facility cost considerations.

Other important features of the modulator according to the invention is the ability to electronically vary the pulse width, and the ability to easily change the pulse repetition rate.

In older-technology modulators using thyratron switches and pulse-forming networks (PFNs), both of these are very difficult, in particular varying the pulse width. In the PFN type of modulator, to generate a shorter pulse, it is necessary to physically disconnect part of the high-voltage PFN. Then, it is usually necessary to readjust (re-tune) the part of the PFN that remains, to restore an acceptable pulse shape. With our new modulator, all one requires to change the pulse width, either slightly longer or significantly shorter, is to put in a longer or shorter trigger pulse from the control system. A control circuit is provided for controlling the trigger circuitry associated with the IGBT switches, and the settings for the length of the trigger pulses in particular. In this way, the pulse width can be varied in a continuum from short to long.

In varying the pulse repetition rate with a prior art thyratron modulator, one can easily fall into a region of "non-recovery" if the pulse rate is increased slightly, which can damage the thyratron and the charging power supply. This occurs when there is not enough time between pulses for the thyratron to recover its ability to withstand the applied PFN voltage. This problem does not exist with our IGBT-based modulator design. If the power supply and modulator have been designed to handle the increased power, there is no reason why pulse repetition rates of 1000 Hz or more cannot be achieved in our new modulator.

Figure 1:
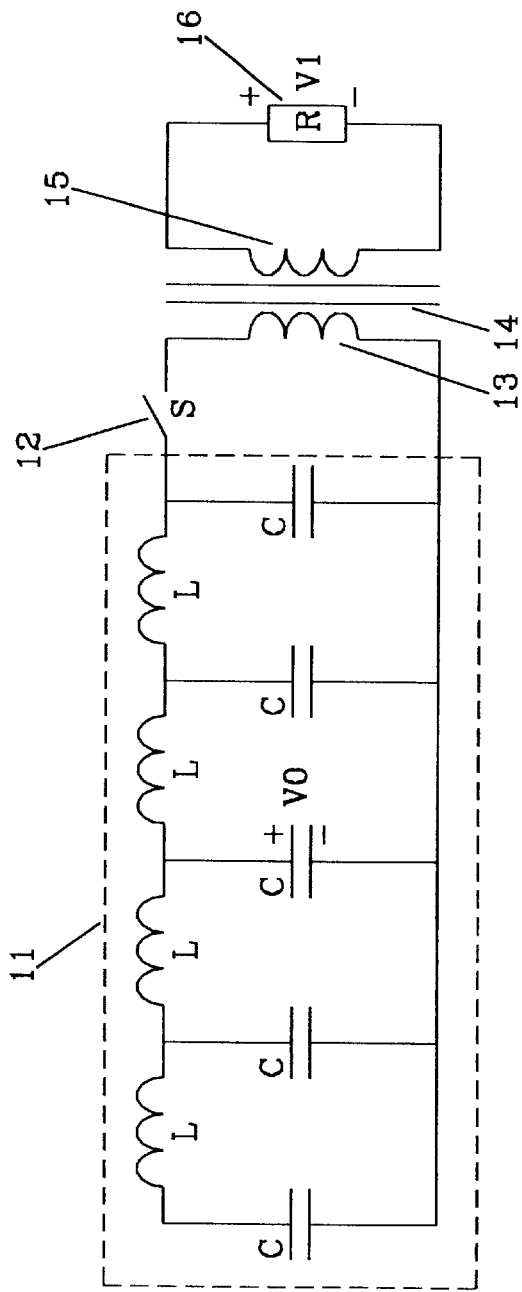
FIG. 1 is a schematic diagram of a conventional power modulator with a pulse forming network (prior art)
Figure 2:
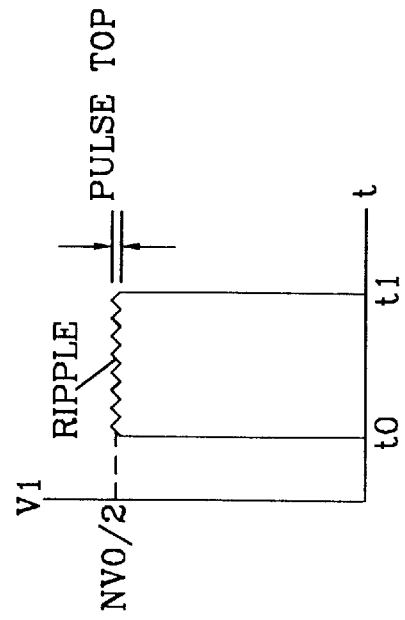
FIG. 2 is a schematic diagram illustrating the output pulse voltage of the modulator of FIG. 1 (prior art)
Figure 3:
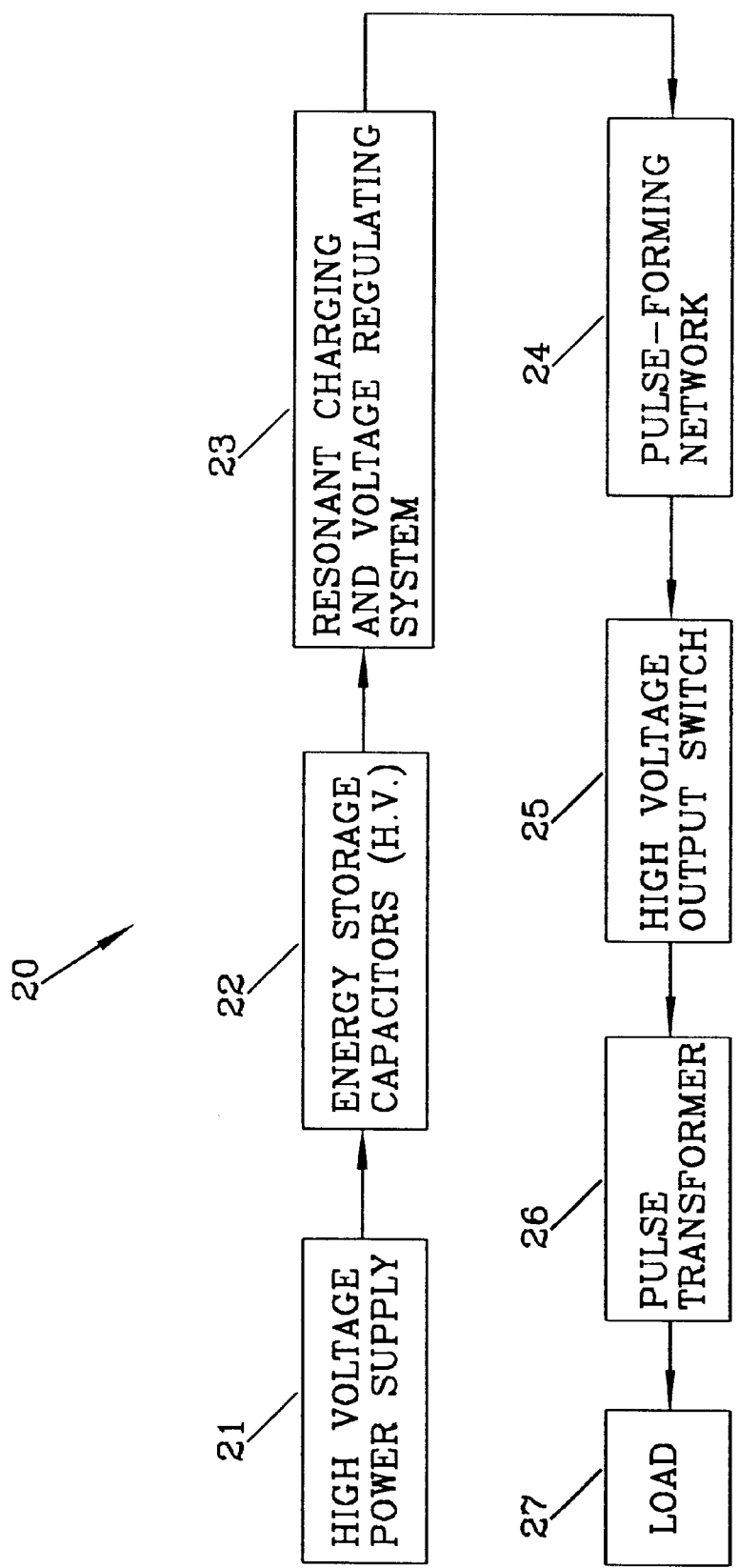
FIG. 3 is a schematic block diagram of a conventional modulator system (prior art)
Figure 4:
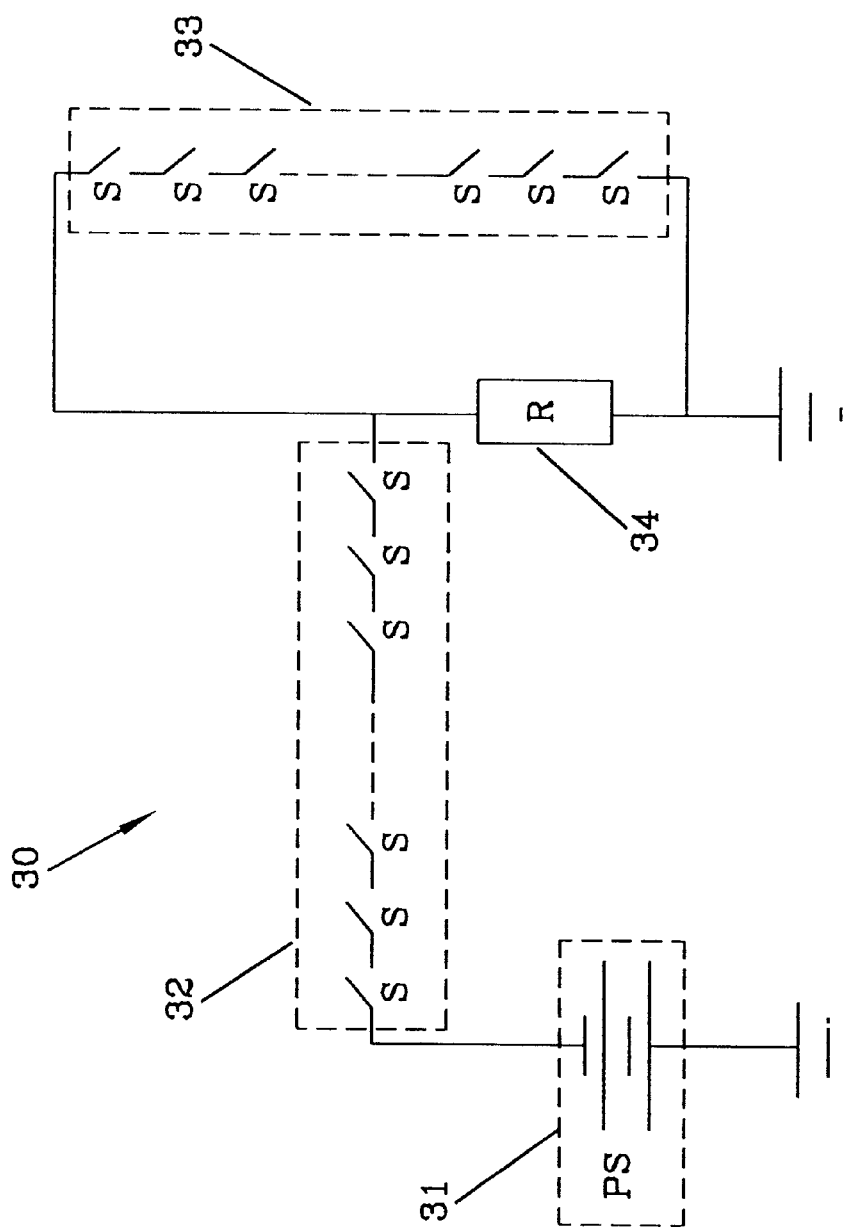
FIG. 4 is a schematic diagram of a prior all high power modulator (prior art)
Figure 8:
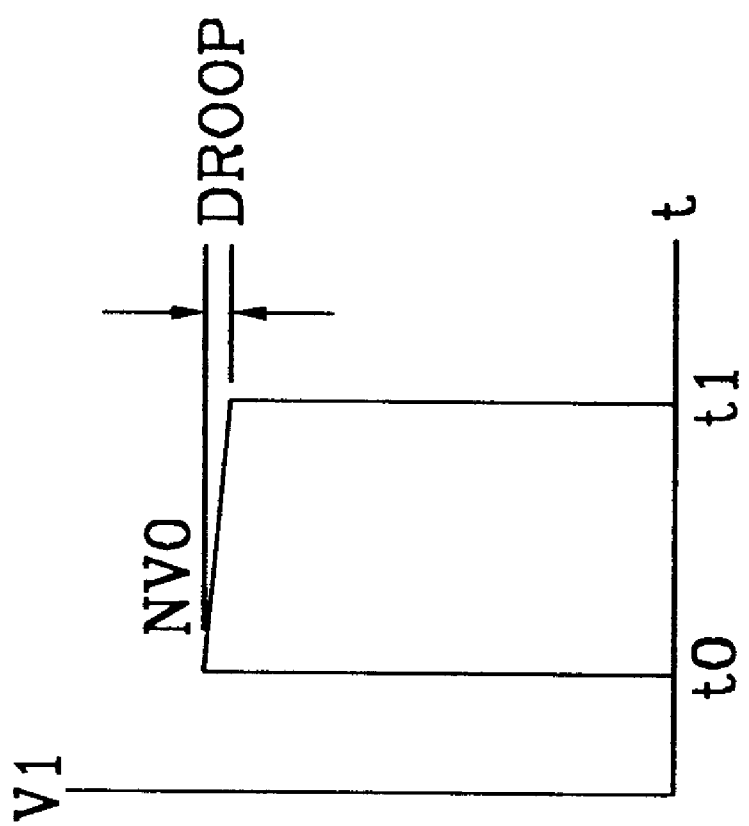
FIG. 8 is a schematic diagram illustrating a voltage droop of the load pulse.

In order to further improve the performance of the inventive power modulator with respect to voltage droop, a voltage droop-compensating circuit is employed. If only the pulse generating circuit of FIG. 6 was used to generate the load pulses, the fact that the capacitors do partially discharge and hence "droop" in voltage might cause the output pulse to "droop" as well (FIG. 8). In many applications, this voltage droop is of minor importance, but for some applications, such as driving a microwave amplifier (klystron, Traveling-wave tube, cross-field amplifier) this would not be an acceptable pulse shape. Consequently, we have invented a simple passive circuit that corrects for this voltage "droop" and restores a "flat" voltage pulse shape at the output of the modulator. This circuit is illustrated in FIG. 9. FIG. 9 is a schematic diagram of a modulator structure with a pulse generating section which includes a voltage droop-compensating circuit, also referred to as a Pulse Compensating Circuit (PCC). The modulator structure 70 comprises a pulse generating section 71, a transformer having a primary winding 76, a core 77 and a secondary winding 78, and a load 79. The pulse generating section 71 includes a capacitor 72, a pulse switch 73, and a Pulse Compensating Circuit (PCC) in the form of a parallel R-L circuit 74, 75. The PCC comprises an inductor Ld 74 connected in parallel with a resistor Rd 75. The PCC operates by dropping a voltage at least equal to the capacitor voltage "droop" across the resistor Rd 75 as the switch 73 closes to begin the output pulse. The inductor Ld 74 carries no current at the beginning of the output pulse, so the desired "droop" voltage can be dropped across resistor Rd 75 without interference from Ld 74. As time progresses, current builds up in inductor Ld 74 and the voltage dropped across resistor Rd 75 decreases as a consequence. This causes a decreasing voltage drop across the parallel R-L circuit 74, 75 which compensates for the declining voltage of the capacitor 72 and tends to hold the output voltage constant during the output pulse duration (FIG. 10). This simple circuit completely replaces the traditional PFN (FIG. 1), with its multiple capacitors and inductances and its complex "tuning" requirement. The Pulse Compensating Circuit 74, 75 is quite compact because it is a low to moderate voltage circuit. Of course, it is possible to use several pulse generating sections 71 and primary windings 76 to drive the pulse transformer.

In a specific embodiment used in connection with a Klystron, the compensating circuit 74, 75 of FIG. 9 has proved capable of holding the output voltage pulse at the Klystron load to a flatness better than one percent of the mean pulse amplitude. In addition, a risetime of about 1 $\mu$s its has been obtained. Furthermore, it is also possible to realize a high repetition rate (100–1000 Hz). Accordingly, the inventive power modulator is well suited for applications in which the output pulse is used for powering microwave amplifier tubes that drive electron accelerator systems. The high frequency short-pulse type of modulator required by microwave amplifiers is best realized by a pulse-transformer based system such as ours, where high voltage is only present where and when it is needed (at the load, for 10 microseconds) and at no other time or location in the system.

There is of course some energy loss in the Pulse Compensating Circuit (PCC), but this has been held to less than 6 percent of the pulse energy by proper selection of the L and R values. However, the energy lost in the PCC is comparable to the energy that would be lost in a PFN plus resonant charging network. The PCC offers the additional benefit that the pulse width can be set by putting a different pulse width in to the trigger circuits for the switches and, provided that the PCC is designed for the maximum pulse width, it is effective from zero to maximum pulse width. With a conventional PFN, changing pulse width is a major task, requiring component changes in the PFN and extensive "tuning" effort.

To summarize, IGBTs are turned on and off electronically, which is a central feature of oui modulator solution not present in other high power transformer-based modulators to date. By using this electronic switch control in combination with Pulse Compensating Circuits (PCCs), that connects the solid-state switches to the pulse transformer, many of the problems associated with Pulse Forming Networks are avoided.

In accordance with a second aspect of the invention, a modulator structure comprising a pulse generator with a number of pulse generating sections, and a pulse transformer with primary windings, equal in number to the pulse generating sections, is utilized. According to a new and inventive connection concept, each primary winding has an independent terminal and a common ground return terminal, and is separately connected through the independent terminal to an individual one of the pulse generating sections. In particular, an IGBT based pulse generating section is connected to each of the individual primary windings (preferably a single-turn primary in each case). These windings are then separated at the "hot" input terminals, with only the ground return terminals in common. This assures equal current flow through each switch and transformer primary. Without this feature, unequal primary current flow is almost assured, with subsequent overheating of some of the primary windings and failure of the transformer.

Figure 11:
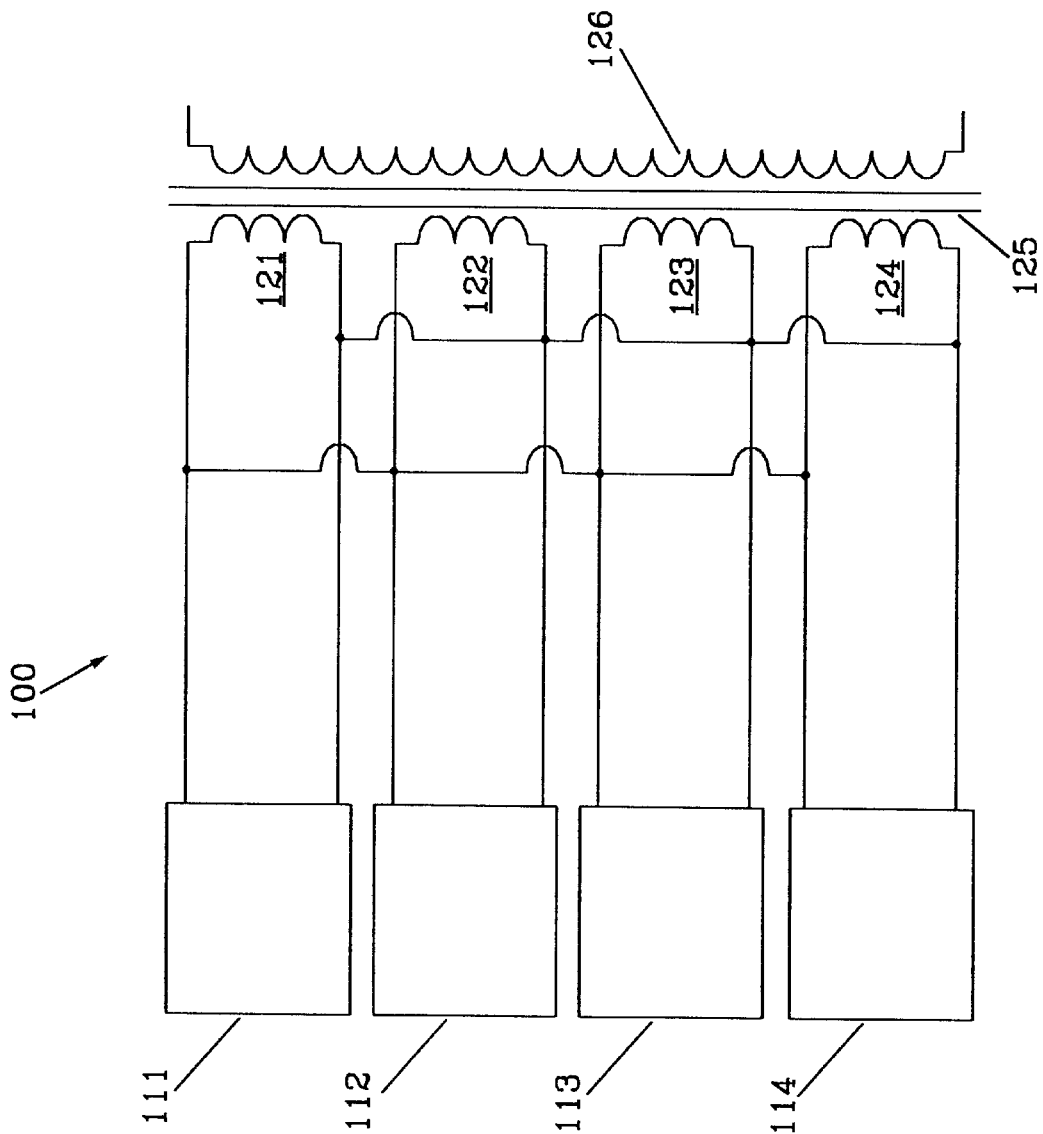
FIG. 11 is a schematic diagram of an all-in-parallel connection of primary windings according to the prior art.

In U.S. Pat. No. 4,682,114 mentioned above in the section related art, the primaries are said to be "connected in parallel". FIG. 11 is a schematic diagram illustrating the "all-in-parallel" connection of the primary windings. The modulator 100 comprises a number of pulse generating modules PGMs or sections 111, 112, 113, 114, and a pulse transformer with a core 125, a number of primary windings 121, 122, 123, 124 and a secondary winding 126. It is apparent from the U.S. Pat. No. 4,682,114 that all their primaries are connected by "hard" electrical connections in a parallel array. If one traces the connections to both sides of any one primary, one finds that all the primaries are connected in parallel at one side by the "hot" (switched) terminal of their modulator and all the primaries are connected at the other terminal to a common "cold" bus. This puts the primaries electrically in parallel, and opens the way for unequal current flow in both the pulse generator modules and the primaries. The primary circuits have very low impedance, and if all are perfectly identical, and "aging" does not alter their resistance or inductance at all, then all should conduct the same pulse current. But in fact, with a small impedance, very small differences in conductor length, connection tightness, temperature, etc. can cause very large percentage differences in the impedance of the primaries, and if they are connected in parallel, this will cause large differences among the currents flowing in the several primaries. It should be understood that the pulse generating modules PGMs 111 to 114 are old-type modules using a separate input power supply, energy storage capacitor bank, resonant charger, Pulse Forming Network, and an output switch of the type that can be turned on electronically but cannot be turned off.

Figure 12:
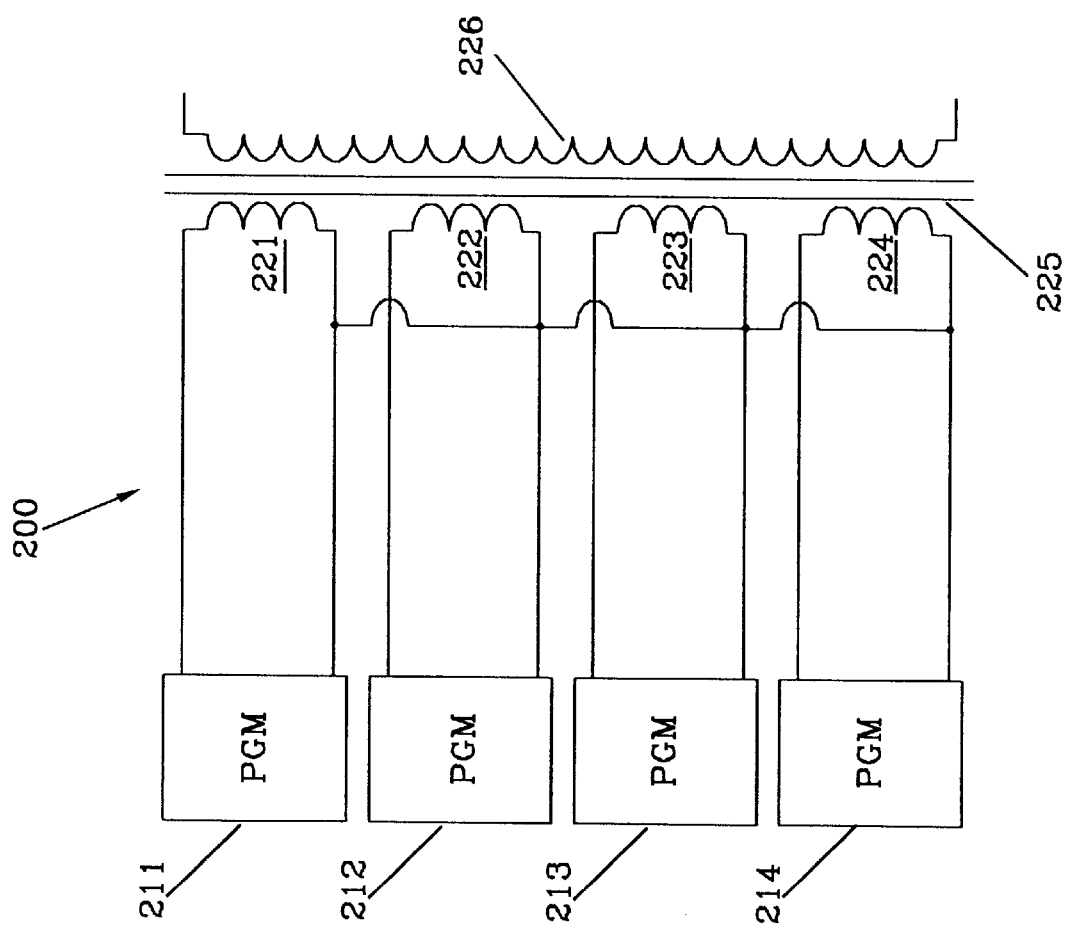
FIG. 12 is a schematic diagram of an inventive connection concept with each primary winding independently connected to its own dedicated pulse generating module.

FIG. 12 is a schematic diagram of a modulator according to the second aspect of the invention. The power modulator 200 basically comprises a number of pulse generating modules 211 to 214, a transformer with a core 225, a number of primary windings 221 to 224 and at least one secondary winding 226. In our modulator design, the primaries 221 to 224 share a common terminal at ground potential, not "hot" as specified in U.S. Pat. No. 4,682,114. Each "hot" terminal (switched terminal) of our primary array 221 to 224 is independently connected to its own dedicated pulse generating module 211 to 214. This helps to force equal current flow in all the primaries 221 to 224 in our modulator. Data taken from a specific realization of our system shows that among 36 pulse generating modules, the current flow differs by less than 10 percent. Note that if our primaries were connected in parallel, as U.S. Pat. No. 4,682,114 shows, this 10 percent variation in current would become much larger, perhaps 100 to 200 percent. The fact that there is any variation at all in our modulator demonstrates that not all the primary circuits have the same impedance, despite our efforts to make them identical. So our independent connection concept is essential to help compensate for these unavoidable differences and prevent these differences from destroying the modulator. The pulse generating modules may be any conventional pulse generating modules known to the art. Preferably however, the pulse generating modules 211 to 214 are of the type shown in FIG. 6 or FIG. 9.

According to a third aspect of the invention, a transformer design that gives a fractional-turn primary effect is utilized. In general, the power modulator is provided with a step-up transformer for receiving first electrical pulses generated by a pulse generator and for producing second higher voltage electrical pulses. The step-up transformer has a core, primary windings and a secondary winding. According to the invention, the core comprises at least two core sections, each core section being surrounded by a respective set of the primary windings, generally distributed equally among the core sections. The secondary winding is wound around the core sections such that the primary windings are within the secondary winding, whereby each one of the primary windings surrounds only a portion of the total magnetic core cross-section of the transformer. This gives a fractional-turn primary effect which improves the transformer turns ratio, making it possible to reduce the physical size of the transformer. This in turn will lead to smaller stray inductance and capacitance.

Preferably, the step-up transformer is of the non-enclosed type, and the core is of C-type with a secondary winding around each of its two legs. Furthermore, there is specifically provided a transformer primary winding design that represents ½ turn (each winding is a single turn encircling only half the total transformer core area) by using single-turn primary windings and two core sections.

This third aspect of the invention and its advantageous will be explained in more detail later on.

A specific problem solved by the invention is how to apply high-power solid state switches which operate at the 1200 to 1400 volt, 600 to 1000 ampere level to generate high power, high voltage pulses at the 120–140 kilovolt, 100 ampere level for powering microwave amplifier tubes used in driving electron accelerator systems and/or microwave generating systems for medical radiation-production applications, radar, anti-pollution treatment of flue gases (DeSOx-DeNOx), sterilization of food, medicine and equipment, curing of paints and inks, and many other potential uses. In particular, we wanted to solve this problem in such a way that high voltages (generally voltages greater than 1000 volts) are only present at the output point of the system and nowhere else in the system at any time. We also wanted to achieve a marked reduction in the size of the equipment with our new solution to the pulse modulator problem. We did this by taking full advantage of many cooperative (synergistic) features of solid-state switches. For example, almost a factor of ten reduction in modulator size has been achieved over systems using the older technologies such as resonant chargers, De-Qing regulators, and separate power supplies, by making a single power supply module that uses IGBT (Insulated Gate Bipolar Transistor) switches in an inverter to charge and regulate the voltage of the new modulator. To our knowledge, this is the first application of a series-resonant IGBT inverter to the problem of charging and regulating a pulsed modulator. Furthermore, IGBT-switches are used in an inventive manner in the modulator itself. By taking full advantage of the cooperative performances of the IGBT power supply and the IGBT based modulator, we have been able to combine functions and reduce modulator volume significantly over that of older modulator circuit designs. In addition, measures are taken to assure equal current flow in the IGBTs and the primary windings associated thereto. Furthermore, the physical size of the transformer is reduced by using a split-core idea that gives a fractional-turn primary effect.

Figure 13:
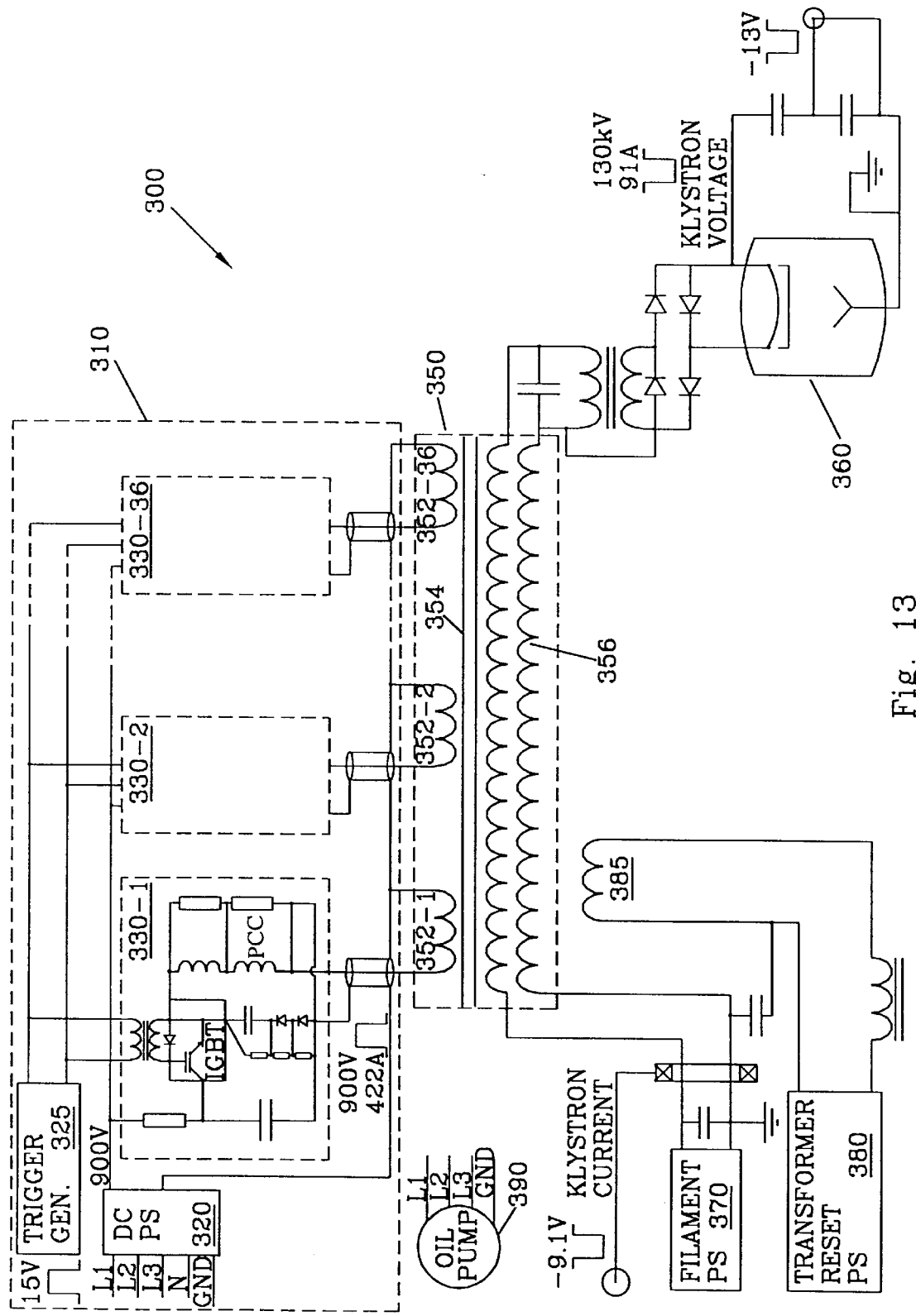
FIG. 13 is a schematic diagram of a specific realization example of a power modulator according to the invention.

FIG. 13 is a schematic diagram of a specific realization example of a power modulator according to the invention which solves the problem specified above. In this particular realization, the power modulator is designed to power a Klystron tube which acts as a microwave amplifier. The modulator system 300 comprises a pulse generating stage 310 for generating initial pulses, a pulse transformer 350 with associated windings that develops high voltage pulses to power the Klystron 360, a filament power circuit 370 to supply power to the hot thermionic cathode in the Klystron 360, a transformer reset power supply 380 and an oil pump 390, all as schematically shown in FIG. 13. The pulse generating stage 310 includes a DC power supply 320 (series-resonant IGBT inverter) that powers the modulator, a trigger pulse generator 325, and a set of pulse generating modules 330-1 to 330-36 which produce the initial pulses. Main parts of the system (the pulse generating stage 310 with the DC power supply 320 and the pulse generating modules 330-1 to 330-36, the pulse transformer 350, the filament 370 and reset 380 power supplies) are immersed in oil for isolating and cooling the system. The oil is pumped through a water-to-oil heat exchanger (not shown) by an oil pump 390 to cool the system.

The pulse generating stage 310 comprises a number (36 in this example) of pulse generating modules 330-1 to 330-36. Each one of the 36 pulse generating modules 330-1 to 330-36, also referred to as sections, comprises an energy storage capacitor (66 microfarads at 1100 V rating), a pulse voltage droop-Compensating Circuit (PCC), in the form of a parallel resistor-inductor circuit, an electronically controllable IGBT switch connected to the energy storage capacitor, and triggering circuitry for the IGBT switch. The 36 IGBT switches of the 36 modules are triggered by trigger pulses from the trigger pulse generator 325. The energy storage capacitors of the 36 modules are all connected to and powered by the DC power supply 320 which preferably comprises a series-resonant IGBT inverter. The pulse generating sections or modules 330-1 to 330-36 are used to drive the primary side of the pulse transformer 350. In practice, 36 individual IGBT switches are combined to generate a high-current (15,000 ampere; 36×422A) moderate voltage (900 volt) pulse to drive the primary side of the pulse transformer 350.

The pulse transformer 350 comprises a number (36 in this example) of primary windings 352-1 to 352-36, each of which has an independent terminal and a common ground terminal, a transformer core assembly 354 and secondary windings 356. Each primary winding 352 is separately connected through its independent terminal to a respective individual one of the pulse generating modules 330.

A main reason for using a plurality of pulse generating modules 330, instead of a single one, is that the power of the load must be divided among several switches due to the present-day capabilities of available solid-state switch packages. In this example, the secondary pulses can be as large as 136 kV at 96 amperes, which is 13 megawatts (MW). If the primary of the pulse transformer is driven by 900-volt pulses, the required primary current is then 13MW/900=14,444 amperes. Available IGBTs are rated at 600 amps, so at least 14444/600=24 IGBTs must be used to deliver the pulse current. We selected 36 IGBTs so each switch would deliver only 14444/36=401 amps, safely lower than the 600-amp rating. A second and equally important reason to use a number of pulse generating modules 330 is that a number of pulse transformer primary turns are needed to fill the available winding space underlying the high voltage secondary windings, in order to minimize transformer inductance and permit fast-rising pulses to be delivered to the klystron load.

The transformer 350 is of the non-enclosed type with a two-legged core assembly 354. The core assembly 354 comprises two identical cores that are mounted adjacent to each other with a small clearance between. Each core is surrounded by a set of 18 single-turn primary windings 352, 9 on each side or "leg". The secondary windings 356, one for each leg of the core assembly 354, surround both cores. In this way each primary winding 352 surrounds only half of the total magnetic core cross section, and the transformer 350 behaves as a "half-turn" primary transformer. To obtain the required 156:1 voltage step-up ratio, only 78 secondary turns are required. Furthermore, we employ 11-turn reset windings 385, one on each side of the core assembly 354 and wound outside the secondary windings 356 and insulated from them. This allows us to reset the core to its proper magnetic operating point after each pulse by passing between 7 and 9 amps of DC reset current through the reset windings 385. This current is supplied at about 10 volts potential (70 to 90 watts reset power) from the transformer reset power supply 380.

The 36 IGBT-switches are operable to turn on simultaneously to start the electrical output pulse of the pulse transformer 350, and operable to turn off simultaneously to end the output pulse of the transformer 350. A control circuit associated with and preferably integral to the trigger pulse generator 325 controls the length of the trigger pulses. This control circuit enables us to easily vary the pulse width of the output pulses of the transformer 350.

Furthermore, we use one of the two secondary windings 356 to conduct current up to the klystron cathode heater (filament) and the other to return this current to the ground-based filament power supply 370, while maintaining voltage isolation between the heater supply and the klystron cathode.

There are at least three reasons to use multiple modules. First is reliability, with its partner, maintainability. Aircraft for scheduled commercial passenger service cannot by law have only a single engine, and they must be able to fly with one engine shut down. Putting all the eggs in one basket is not the safest way to fly. Neither is it the most reliable way to build a power modulator. Our modulator can operate with up to four of its 36 modules out of service and removed from the modulator, with minimal degradation in performance. Also, because the modules are preassembled and pre-tested, and are designed to simply "plug-in" to the modulator assembly, they can be replaced in a few minutes. It takes hours or sometimes days to repair the older non-modular types of modulators. Of course, if there are too many modules, reliability is also compromised, as the "parts count" becomes very large and failures become more likely once again. There is a "best range" for the number of modules, and that is determined in part by reason number two, switch capability.

Switch capability is a principal determining factor in causing us to use multiple modules. Having realized the capabilities of solid-state switches such as the 1200-volt, 600-ampere IGBT, we then needed to invent a correct way to employ these switches. Connecting them in series as in U.S. Pat. No. 5,444,610 did not appeal to us, for reasons stated in the section of related art. Connecting the switches in parallel did not appeal either, for the reasons given in our discussion of U.S. Pat. No. 4,682,114 above. But connecting them to individual primary turns of a pulse transformer, with a common ground connection but isolated "hot" connections, appeared to us the best way to proceed, and we have proved this idea works very well. In a particular application we wanted to generate a 140 kV pulse at about 100 amperes; the peak pulse power is 14 megawatts. If we were to do this with a 900 volt primary voltage, the primary current is then 14 million divided by 900, or 15,556 amperes. To handle this current with 600-ampere IGBTs, at least 26 switches are needed. We had decided to connect each switch to a single primary turn of a pulse transformer, and we further wanted to "split" the core into two identical cores, giving four locations, one on each of the four core "legs", where primary windings are needed. To make the four primary structures equal, we needed to use a number of modules divisible evenly by four, so 26 would not do. The next choices, 28 and 32, both seemed to allow too little safety margin for the IGBTs, so we selected 36 modules, which allows the 600-amp IGBTs to operate at about 432 amps, a 39 percent margin of safety with respect to the current rating. This permits small differences in the module connection and transformer winding resistance without causing some IGBTs to operate above 600 amps. In our 36-module assembly, measurements during operation show that the highest module current we see is only about 10% from the average.

Yet a further reason for using a modular approach is winding geometry. In the older-technology pulse transformers, the designers realized that making the primary and secondary windings equal in axial length and coaxial with each other gave the lowest inductance and consequently the fastest-rising pulses. In our winding geometry, we maintained this idea. To do this, we needed a number of single-turn primary windings to "spread out" along the length of the core, lying under the secondary. Again, this minimizes stray inductance and has given us fast pulses. We could not do this with just one single-turn winding; we needed several individual turns to occupy the space formerly taken up by the older-technology multiple-turn, high voltage primary windings. So once again, multiple pulse generator modules are needed.

A final reason for using multiple modules is fault mitigation. The total energy stored in all 36 of our pulse generating modules is about 1118 joules, at 970 volts maximum module voltage. If we were to store all this energy in a single module, the consequences of a fault (accidental short circuit) in this module or in the connections between it and the pulse transformer could be severe. This is roughly the energy of a small-caliber pistol bullet, and the mechanical forces resulting from the current flow at this energy level through a short circuit can bend copper bus bars and destroy insulation. By subdividing this energy into 36 packages of only 31 joules each, we greatly reduce the probability of serious collateral damage resulting from a short circuit.

In summary, our new modulator ideas solve for example the specific problem, among many other problems, of using low to moderate voltage, high current pulse generating circuits, which are inherently safer and have longer expected lifetime than the older high voltage pulse forming systems, to generate high voltage rectangular pulses which are needed to drive a wide variety of electron beam devices (microwave tubes such as TWTs, klystrons, CFAs and magnetrons) and/or electron or ion guns to meet the requirements of a large number of medical and industrial applications. Our solution to this problem is unique in that it allows the IGBT type of switch to be used, where other conventional approaches require higher-current, higher-voltage SCR type switches due to their transformer design being more inductive than ours. Also, conventional circuits need pulse-forming networks to shape the pulse and turn off the switch, since an SCR cannot be turned off electronically. When PFNs are used, the primary drive voltage is automatically doubled for a given output voltage.

It should however be understood that the power modulator ideas according to the invention can be used to solve a wide variety of pulse generating problems. The basic principles of the invention are even applicable to the problem of producing a lower voltage than the initial voltage.

For the interested reader, general information on pulse generators can be found in Vol. 5 of M.I.T. Radiation Laboratory Series on Radar; "Pulse Generators"; Glasoe and LeBacqz, Wiley, N.Y. (from the late 1940's).

The transformer related aspects of the invention, briefly discussed above, will now be described in more detail below. First however, with the intention of giving the reader a physical "feel" for the kinds of calculations one does to design a transformer, a short introduction to this subject will be made in the following.

The fundamental physical fact underlying all transformer design is this: given a bar of magnetic material of cross-sectional area A, if one winds N turns of wire around the bar and applies a voltage V across the ends of this coil for a time T seconds, the magnetic flux density B (in Teslas, MKS unit system) in the magnetic material will change from its initial value (presumed to be zero) to a final value equal to VT/NA Teslas at time T seconds. In simple algebra, we have:

$$B = \frac{VT}{NA} \qquad (1)$$

From this simple relation many of the fundamental parameters and limitations of (pulse) transformers follow.

The quantity B cannot exceed a value which is determined by the magnetic properties of the core material, called the "Saturation Flux Density", denoted Bmax. So if one wants to double the voltage, for example, keeping the other parameters (pulse duration T, cross-sectional area A) constant, and B is at the limiting value already, then one is forced to double the number of turns N to satisfy the fundamental relation given above.

This leads to the simple concept that, given a pulse duration T, a cross-sectional area A, and a specific type of magnetic material with a known value of Bmax, then the quantity V/N, the "volts per turn" is fixed. This is a useful short-cut in designing a transformer when given a specific piece of magnetic material to work with.

To solve our specific problem that is related to powering of microwave amplifier tubes, we are required to generate a 140 kV pulse lasting 10 microseconds. Low-loss transformer steel has Bmax of about 0.9 Tesla, or 9000 Gauss in the older cgs units. This leaves us free to choose the other two parameters, number of turns N and core area A. One can choose different values of N, for example, and use Equation (1) to find the corresponding core area A (or vice versa, of course). This is called "iterative design" and is very commonly the way magnetic components are designed. The design is made more definite by the fact that magnetic flux, like electric current, must be given a closed "circuit" in which to flow. Although a simple bar of material was used to state Eq. (1), this bar must form a close loop or "magnetic circuit" like the core sketched in FIG. 14 to permit the magnetic flux to flow.

So, for example, one might choose 10 turns of wire to solve our 140 kV transformer problem. Then the area A becomes (A=VT/NB) 0.156 m². Bending a bar with this big a cross-section into a closed loop like FIG. 14 makes a loop containing a mass of steel (magnetic material) roughly equal to 2400 kg, which is quite massive.

Choosing 100 turns gives an area of about 0.0156 m². If a steel bar with this cross-section is bent into a closed loop similar to FIG. 14, leaving enough area open inside the loop (the so-called "window" area) to allow the passage of 100 turns of wire and to assure adequate spacing between the wires to prevent voltage breakdown at 140 kV, the resulting steel mass is roughly 150 kg, much more sensible. By repeating this exercise a number of times, it develops that a minimum mass of steel is found. Choosing too many turns leads to a very small cross-sectional area of steel but a very large "window" area, and the mass increases with increasing turns. Too few turns leads to a very large cross-sectional area of steel, but a small "window" area; with too few turns, the mass is found to rise as the number of turns decreases. Between these extremes, there is a "best" number of turns, leading to the minimum-mass design.

The above introduction to transformer design should make the following comparison between a specific realization of our transformer and the type of transformer disclosed in U.S. Pat. No. 4,682,114 easier to follow. A "side-by-side" design calculation for the two transformer types will be made, assuming that both transformers are designed to deliver the same pulse to the same load.

To realize our specific design, we decided to use IGBT switches that were rated at 1200 volts and 600 amperes maximum. We wanted to run these safely, so we "de-rated" them to about 80 percent of the manufacturer's ratings. Then we needed to develop 140 kV pulses with a switch delivering at most 1000 volts. We allowed a voltage margin for the PCC (Pulse Compensating Circuit, FIG. 9) to operate, and settled on 900 volt output pulses with 970 volts on the capacitor and 70 volts dropped on the PCC. So to make 140 kV requires a transformer turns ratio of 140,000/900=156:1.

Equation (1) can be used to show that if one winds N1 turns on a magnetic core and applies V1 volts, and then surrounds this winding with another of N2 turns, the voltage measured on this second or "secondary" winding must be V2=V1×N2/N1. This is the basic principle of transformer action. So if we have a source of 1000 volts and need to develop 140 times that voltage (140 kV), a turns ratio of 140:1 is indicated (with a 900 volts drive, a 156:1 turns ratio is needed). If we stop thinking at this point, we come up with a design solution typical of conventional transformer type power modulators, including that of U.S. Pat. No. 4,682,114. It is a single winding on a magnetic core (in this case the high voltage winding, commonly called the secondary winding), surrounded by another single winding (the primary winding), with the secondary consisting of 156 turns and the other essentially a single turn.

According to the invention, this is not the place to stop.

Assume that we use a switch, the IGBT-switch, that can safely deliver 900-volt pulses. If we use one-turn primary windings and drive these with several such switches, each winding independent of the others, we must use a 156-turn secondary winding to get 140 kV. But equation (1) allows another idea as well. Suppose we take two identical magnetic cores, drive each one with a set of one-turn windings around it at 900 volts, and wind the secondary around BOTH cores (see FIG. 15). In other words, wind the secondary windings outside the primary windings. Then we have enclosed TWICE the magnetic flux as we had with a single core. So the "volts per turn" on the new secondary will be twice the old value. Then 156 turns would give not 140 kV but 280 kV! So to get 140 kV we only need 78 turns. That is a good thing to do, for many reasons. The main reason is that it reduces the stray inductance and capacitance of the transformer, by making the entire transformer physically smaller. These stray elements are both proportional to physical size, and it takes less winding length to wind a 78 turn coil than a 156 turn coil. The smaller the transformer, the less stray losses it will have.

Figure 15:
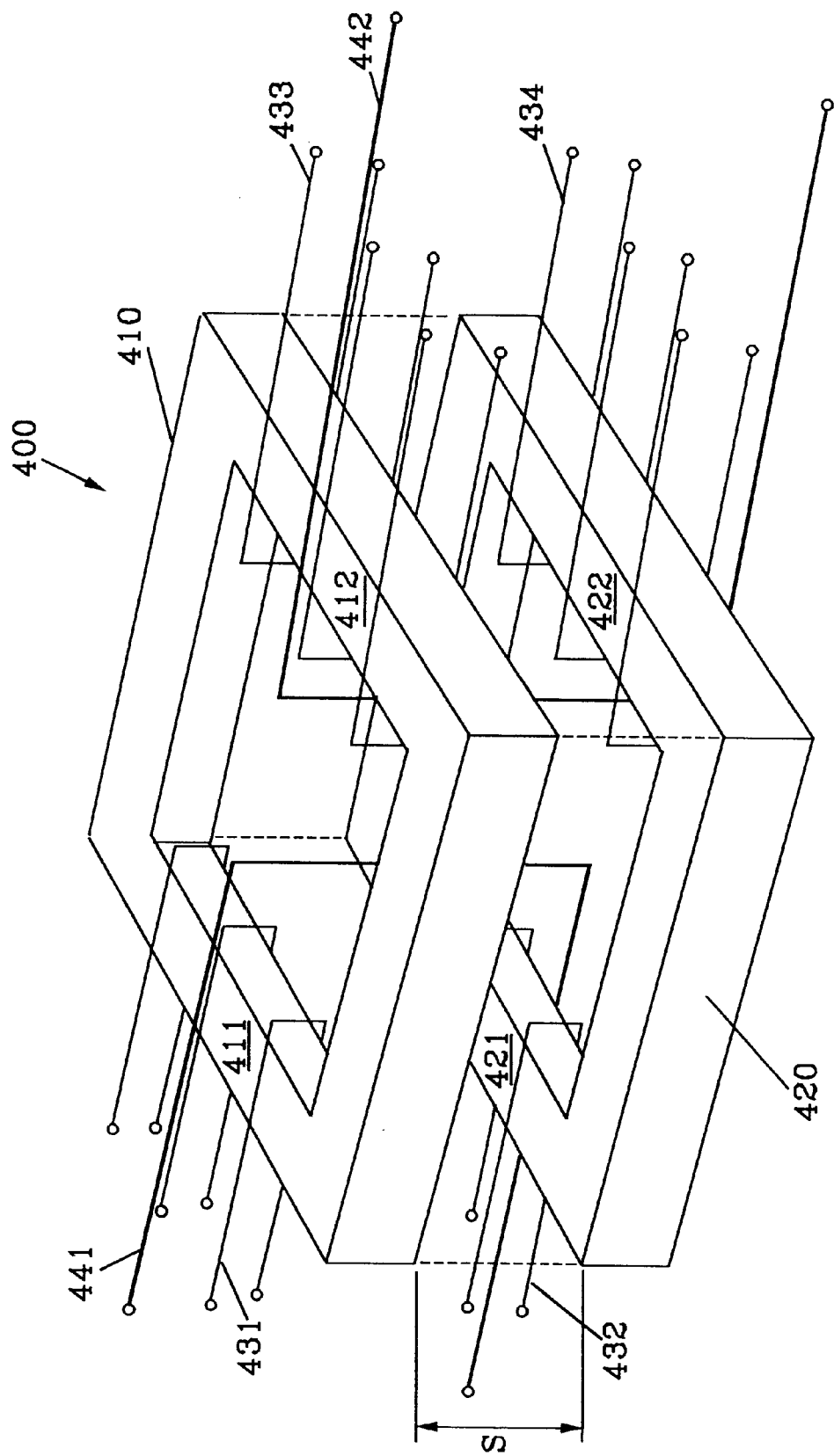
FIG. 15 is a schematic perspective view of a transformer core assembly according to the invention.

FIG. 15 is a schematic perspective view of a transformer core assembly according to the invention. The transformer core assembly 400 is composed of two identical magnetic cores 410, 420. Three or more cores could be used, but in the modulator that has been built, two cores are used. These cores 410, 420 are rectangular in shape, made of magnetic material (thin layers of transformer steel), and stacked up adjacent to each other with a small clearance S, enough to separate the primary windings. The cores could be made of other magnetic materials, depending on the parameters of the pulses that need to be transformed by the pulse transformer; examples of such materials are powdered iron in an epoxy binder, ceramic ferrite material, etc. The cores generally have two long sides and two shorter sides. The long sides 411, 412, 421, 422 are called "legs", and transformer windings are installed that surround each "leg". Primary windings and secondary windings surround the "legs". There are four "legs" 411, 412, 421, 422, two per core, in the assembly 400 of FIG. 15. In our existing modulator realization, each "leg" has nine single-turn primaries surrounding it. Thus, there are 36 single-turn primary windings in all, 18 on each of the two cores. For reasons of simplicity and clarity, only three primary windings per leg are illustrated in FIG. 15. Each such set of three primary windings is referred to with the reference numerals 431, 432, 433 and 434, respectively. The secondary windings 441, 442 surround both core "legs, a first secondary winding 441 wound over legs 411 and 421, a second secondary winding 442 wound over legs 412 and 422. In our realization, these two secondaries 441, 442 each have 78 turns, and the net transformer voltage step-up ratio is 156:1. The transformer cannot be considered as a simple pair of windings (primary and secondary) emerging from a "black box". If one volt is applied to one winding, the output voltage will be only 78 volts (78:1 step-up ratio), because only one of the two cores in the "multiple core" assembly will have magnetic flux circulating in it.

Another way of expressing the multiple-core feature of the invention is to say that the core is split (split-core) into a number of core sections, where each core section is surrounded by a respective set of primary windings, generally distributed equally among the core sections. If a single secondary winding is considered, the secondary winding is wound around the core sections such that the primary windings are within the secondary winding. This means that each one of the primary windings surrounds only a portion of the total magnetic core cross-section of the transformer, giving an effect of a fractional-turn primary winding.

Figure 14:
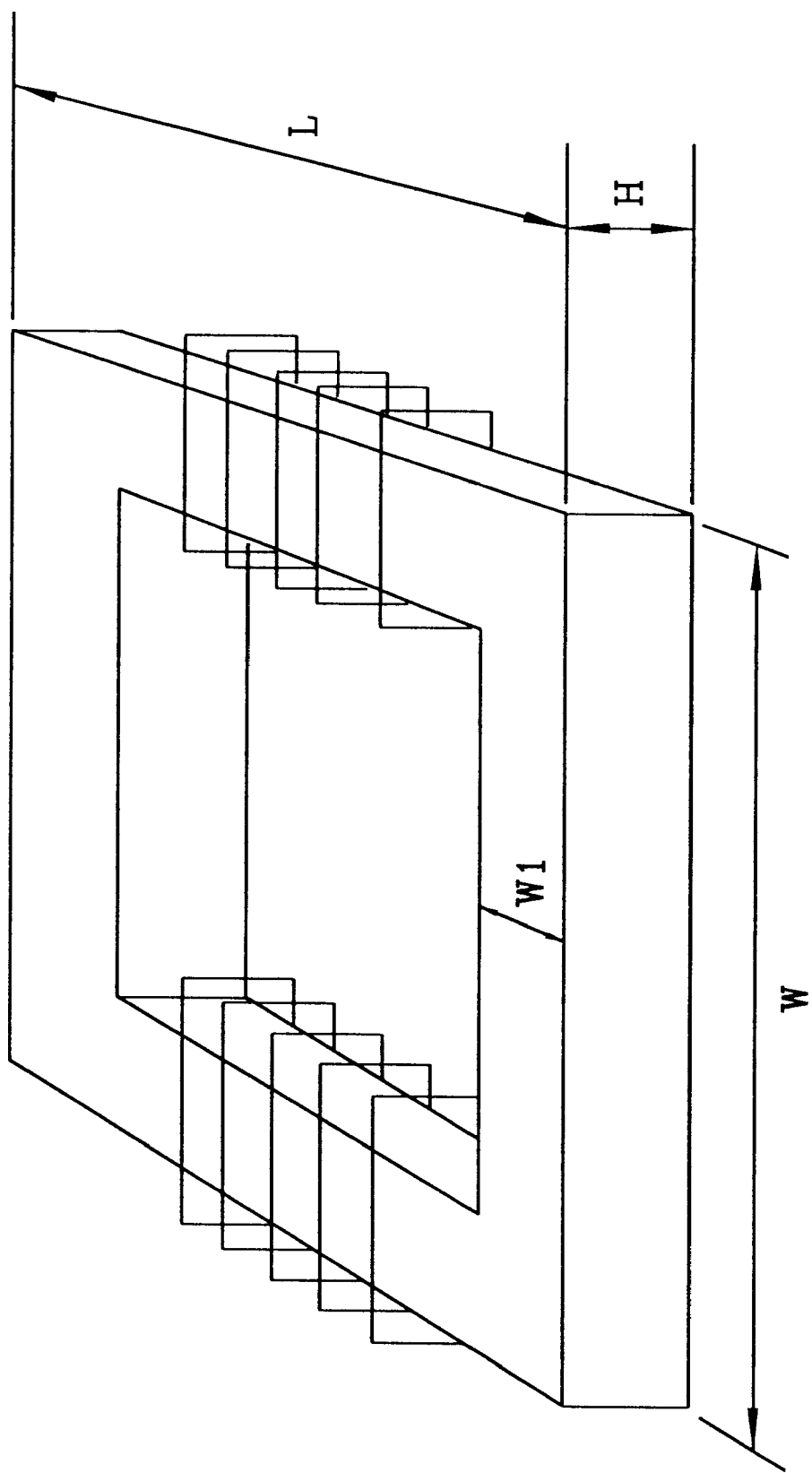
FIG. 14 is a schematic perspective view of a transformer core.

Assume that the total height, with both cores 410, 420 added together, of the core assembly 400 of FIG. 15 is equal to H (the height of the core of FIG. 14). The cross-sectional area of each core 410, 420 is then H/2 times W1, assuming the same width as in FIG. 14. If each core is driven with one-turn primary windings at 900 volts, with a 10 microsecond pulse width and Bmax of 0.9 Tesla, and a reset system is used to apply a "bias" to the cores so when the pulse begins, the cores have a B field of –0.9 T in them (a negative-going static B field), then the total "swing" of B field available before saturation occurs is 1.8 T. In other words, the B field can change from –0.9 T to +0.9 T.

It is necessary to drive at least one winding on each of the two cores to obtain an output voltage 156 times the voltage input, as both cores must contain flux in order to induce the correct voltage in the secondary windings.

Then Eq. (1) says the cross-sectional area in this case should be 0.00495 m$^2$. We allow 10 percent more area as a safety margin against over-voltage, so we use 5500 mm$^2$ as the area. The cores we used have thickness H/2 of 75 mm and width W1 of 75 mm, giving the required 5500 mm$^2$ area. The winding length is approximately 160 mm, and the clearance between the inner surface of the core "window" and the high voltage end of the secondary winding is 25 mm, so the "window" length is 185 mm, and the overall length L of the cores (see FIGS. 14 and 15) is 335 mm, the inner window length plus twice the width W1.

The outer width W of the cores is 80 mm, the inner window width; plus 2W1, or 230 mm. The inner window width is twice the spacing between the secondary and primary windings (30 mm each side, 60 mm total), plus 20 mm for insulating tubes to support the primaries. The secondaries almost touch each other at the centerline of the transformer. The total volume of transformer steel is approximately 0.0094 m$^3$, and the mass of the steel is about 80 kg. The complete transformer has outside dimensions of about 340×230×310 mm, and a package volume of about 0.024 m$^3$.

Each of the two secondary windings contains 78 turns, and since two cores are enclosed, each driven by single-turn windings, the resulting output voltage if 900 volts is applied to the primaries is 900×78×2=140.4 kV, as required. The two secondary windings have the same polarity, and are connected in parallel at both ends by small capacitors. This allows the secondaries to be used as two separate conductors for a low-voltage circuit to supply power to the heater-cathode of a microwave tube such as a klystron or magnetron, which has a cathode that "floats" at negative high voltage, being connected to the output end of the secondary windings.

Figure 16:
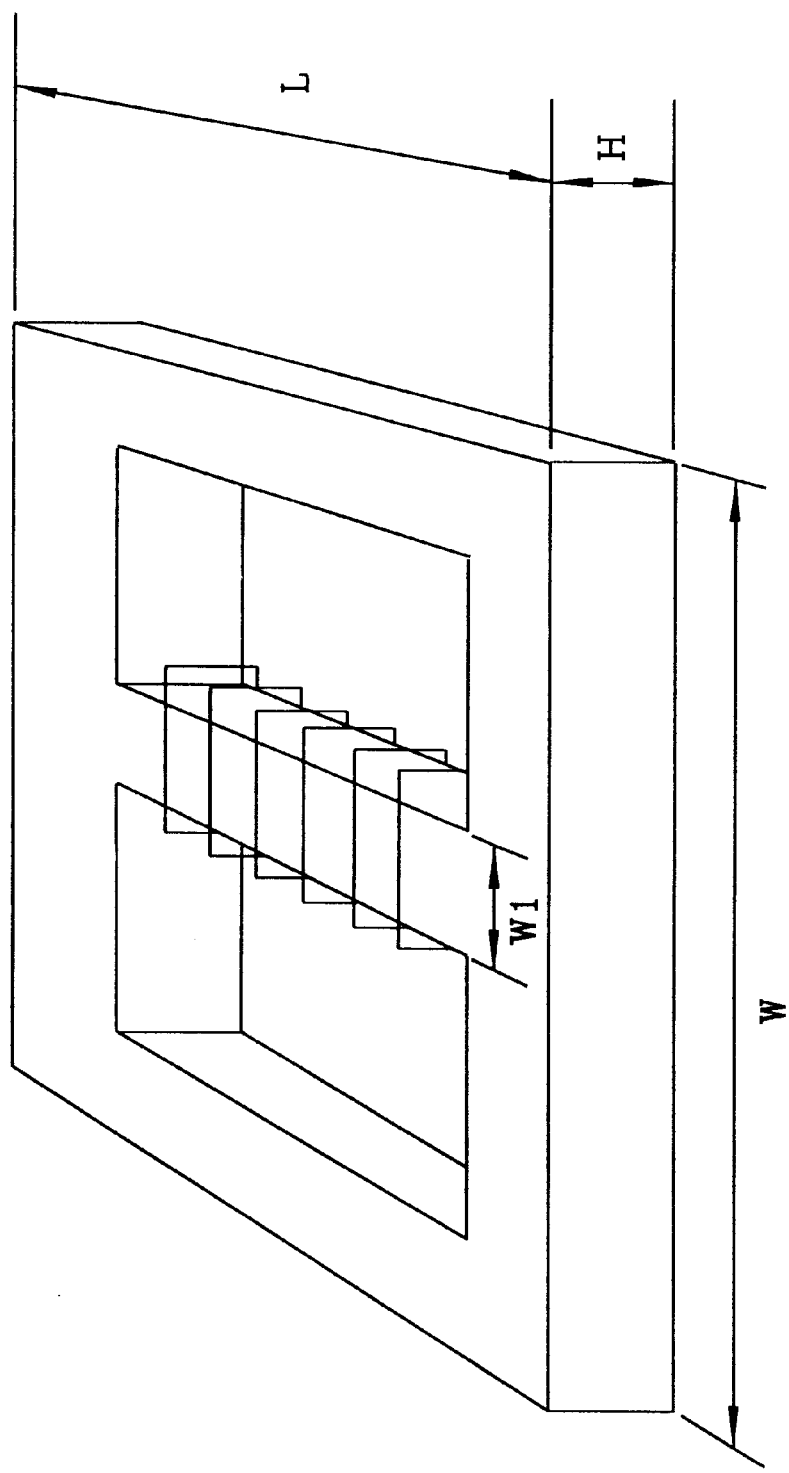
FIG. 16 is a schematic perspective view of a transformer core according to the prior art.

Turning to the design of U.S. Pat. No. 4,682,114, no mention is made of the need to supply power to a hot-cathode microwave tube or other electron-beam tube. To do this, it would be necessary to wind two secondary windings next to each other on the center "leg" of their transformer core (FIG. 16). Also, since their primaries are stipulated to be wound OUTSIDE the secondary winding, they can use no less than one-turn primaries (while we have made the equivalent of a ½-turn primary by stacking up two sets of one-turn primaries INSIDE the secondaries as described above). So, while our secondary windings use 78 turns to develop 140 kV, the design of U.S. Pat. No. 4,682,114 would need to wind 156 turn secondaries, two windings interleaved for filament power circuit provision, on their center core "leg" in order to use our inventive 900-volt primary driver module idea. Their secondaries have twice the turns of ours, at the same voltage and pulse width, so Eq. (1) says the cross-sectional area of their center core "leg" can be half of ours, or about 2800 mm$^2$. But the length of their total secondary structure must be almost four times ours (two interleaved secondaries, each with twice our turns) to maintain the same voltage stress along the winding and hence the same safety against breakdown.

The center "leg" of their transformer would then be about 740 mm. long at the inside of the "window". The core width W1 would be about 75 mm, as ours is, but the height H would be 75 mm while ours is 150 mm. Allowing the same electric stress level in the design as we have used (which sets the spacing of the secondary from both the core and the primary windings that surround it), their transformer (FIG. 16) would need an overall core width W of about 370 mm and an overall core length L of about 890 mm. A small factor which apparently is overlooked in U.S. Pat. No. 4,682,114 is that the outside "legs" of their three-legged core could each have half the cross-sectional area of the center "leg" if they so desired, since half the magnetic flux that flows down the center "leg" returns through each side "leg" to complete the magnetic "circuit" of the transformer. There is no indication in the U.S. Pat. No. 4,682,114 that their transformer would be built to take advantage of this savings in mass, but for the purpose of the present discussion we grant it anyway, and this yields an approximate steel volume for the their design of 0.01 m$^3$. Compared to our steel volume of about 0.0094 m$^3$, the designs look almost the same. But the outside dimensions of the transformer shown in the U.S. Pat. No. 4,682,114 give a "package volume" of about 0.064 m$^3$ as compared to our 0.024 m$^3$; our design has only about 38% of the volume of the U.S. Pat. No. Design 4,682,114, due to the better "shape factor" afforded by our use of the "split-core" or "½-turn" primary design.

The system size of the circuit of U.S. Pat. No. 4,682,114 would be much larger than we have achieved. Their circuit design also has relatively poor electrical performance in terms of inductance and capacitance, and these factors will now be discussed.

So far, we have used only Eq. (1), the fundamental transformer design equation, and the restriction that the electrical stresses (volts/meter) in our design and the U.S. Pat. No. Des. 4,682,114 be the same. From these simple constraints, we have shown that the U.S. Pat. No. 4,682,114 patent transformer design is much larger than ours by necessity. Turning now to a similar discussion of transformer inductance, we first describe the effect inductance has on modulator performance.

Inductance is the tendency of an electric circuit to resist changes in the current flowing in it. It is analogous to mass, in that mass causes physical objects to resist changes in their velocity. This resistance we call "force" in mechanics and "voltage" in electronics, and they are again analogous concepts. In a pulse transformer, the objective is to deliver a rapidly changing current to a load, so inductance, which tends to prevent rapid changes in current, is a detriment to this purpose.

Pursuing the analogy further, the kinetic energy stored in a mass moving at some velocity is proportional to the mass times the square of the velocity. If inductance acts like mass, and current flow is analogous to velocity, one might expect an inductance to store electric energy in proportion to the value of the inductance times the square of the current flowing in the inductance, and that is precisely how inductance behaves. It also gives us a way to estimate the inductance of a structure of conductors like a transformer, and to compare the inductance of one such structure with a different structure.

Electrical energy is stored in the space surrounding a conductor, either as "electrostatic" energy, where we speak of "capacitance", and "voltage", and which is proportional to capacitance times the square of voltage, or as "magnetic energy", where we speak of inductance and current, the energy being proportional to inductance times the square of current. But in the space where the energy is stored, within the "electromagnetic field" that surrounds a current-carrying structure, one speaks of "energy density" in the space, and energy is then proportional to this energy density times the volume occupied by the fields. The energy density is proportional to the square of the field magnitude, either E(volts/meter) squared or H(amperes/meter) squared for capacitance and inductance, respectively. This gives us a basis to easily estimate inductance (and capacitance) and to compare their relative sizes for different transformer designs.

The H field (magnetic intensity) equals amperes flowing along a surface divided by the width of that surface in the direction perpendicular to the current flow. A one meter wide copper plate carrying a current of one ampere along its length (in the direction perpendicular to the width of the plate) has a magnetic intensity H of one ampere per meter in the space next to the surface. If another plate, also one meter wide, is placed parallel to the first plate, and one ampere also flows along this plate but in the opposite direction to the first current flow, the magnetic intensity remains the same in the space between the two plates (one ampere/meter) but is now zero in all the space outside this volume. If the plates are connected together at one end, forming a "closed circuit" for the current flow, down one plate and back the other, the space between them contains magnetic energy and the circuit has inductance. If one tries to suddenly increase the current flow to two amperes, the system will resist this change by producing a voltage between the plate ends in a direction to oppose the current change. This voltage will be inversely proportional to the time interval of the intended change in current. That is, if one is trying to change the current by one ampere in one microsecond, the voltage will be some value V volts. If the change is attempted in half a microsecond, the voltage will be twice as large, 2V volts.

Summarizing, inductance is proportional to the volume contained between current "sheets" of equal current and opposite direction. Also, inductance will resist a change in current flow in such a way that if you want to make a given change in a given time, you will need to apply a certain voltage V to make the change; if you want to make the same change in current in half the time, you must be prepared to apply twice the voltage to do it, or if in ¼ the time, then four times the voltage, etc.

Using these simple concepts, we can compare the relative values of inductance for our pulse transformer design and that of the U.S. Pat. No. 4,682,114. Looking at FIG. 15, suppose a current of 100 amperes is to be delivered to a load from the secondary windings of our pulse transformer. This current will flow equally in our two secondaries, 50 amperes in each, as they are connected in parallel. The direction of current flow is mainly "around" the core, as the windings encircle the core. So the H field will equal the total current flow around the winding (the number of amperes flowing times the number of turns that surround the core) divided by the length of the cylinder on which the winding rests, as this dimension is perpendicular to the direction of current flow. If each of our secondary windings has 78 turns and has an axial length of about 160 mm, as stated previously, the total current flowing around the secondary circumference is 78×50=3900 "ampere-turns", and the H field in the space next to the secondary wires has a value of 3900/0.16=24,375 ampere-turns per meter. The secondaries are spaced about 30 mm from the primary windings, which form a cylinder coaxial with and immediately beneath the secondaries, and which have the same total circulating current and length, hence the same H field next to the primary turns. The volume of space contained between each secondary and primary cylinder in our transformer design is about 0.000912 m$^3$. This takes into account the fact that the spacing from secondary to primary is widest (about 30 mm) at the high voltage end of the structure and "tapers" down to a much smaller distance at the "ground" ends of the windings. The volume of this hollow pyramid is ⅓ times the base area times the height.

The magnetic energy stored in the space between each of our two secondaries and primary arrays is proportional to H squared times this volume. In this case the number is about 542,000. There are two identical winding structures, each storing the same energy, so in the complete transformer the total number proportional to magnetic energy is 2×542,000=

1,084,000. The net inductance at the output of the transformer is then proportional to this energy number divided by the total output current squared (100 amps squared, or 10,000), so the relative inductance in this system of physical units is about 108.

Turning to the transformer of the U.S. Pat. No. 4,682,114, discussed and dimensioned above in relation to FIG. 16, we make the turns ratio equal to 156:1. We also note that the secondary, which in this transformer is wound immediately adjacent to the core, has the same voltage (140 kV) between itself and the core as it has between itself and the primary which is wound above it. So, since we used a 30 mm spacing to insulate this voltage in the calculations done above, we use it again here. Then the secondary is spaced 30 mm from the core at its high voltage end. This means if the core is 75 mm square, then the secondary is 135 mm on a side. The primary, which is again 30 mm above the secondary, must be 195×195 mm in cross-section.

The total current of 100 amps flows in the single 156-turn secondary, which is about 740 mm long, so the H field in the space is 156×100/0.74=21,000 amps/meter. The volume between primary and secondary, using the same 30 mm spacing and "taper" as in our transformer calculation, is about 0.00488 m$^3$, so the magnetic stored energy is proportional to H squared times the volume, or 2,150,000. Divide this by the square of output current (10,000), and the relative inductance number is 215. This is a factor of 215/108=2 times larger than the output inductance of our pulse transformer. This fact, plus the nearly 3 times larger mechanical volume of their design, makes it very unattractive to use in microwave amplifier tube applications. And still there is one more factor to consider; stray capacitance.

As one moves along the interior of a transformer winding from the low voltage end to the high end, the voltage difference between primary and secondary windings increases, but so does the physical spacing between the windings. This keeps the electric field magnitude E reasonably constant between primary and secondary, as it equals the voltage divided by the spacing.

The capacitive stored energy of the structure is proportional to E squared times the volume of the structure. We have computed above that the volume between primary and secondary for our transformer is about 0.000912 m$^3$ per side, or 2×0.000912=0.001824 m$^3$ in total. For the U.S. Pat. No. Design 4,682,114, this volume is about 0.00488 m$^3$. So the stray capacitance of their transformer would be at least 4880/1824=2.67 times that of our design. But in the U.S. Pat. No. 4,682,114 transformer, there is an additional stressed volume between the secondary and the grounded transformer core, as the secondary is wound BENEATH the primaries. This doubles the stray capacitance again, making it about 2.7×2=5.4 times as large as ours.

This causes a very serious limitation on the pulse transmission performance of the transformer. In our design, the actual series inductance measured on the secondary side is 345 microhenries, and the stray capacitance (measured) is 300 picofarads. The load resistance (140 kV, 100A) is 1400 ohms. These R, L and C elements make up a network which will "ring" if the value of Q exceeds ½, and Q equals R times the square root of the ratio C/L. For our transformer, Q is then 1.3, so some overshoot will occur on the output pulse voltage, and steps must be taken to reduce or eliminate it. For the design of U.S. Pat. No. 4,682,114 the Q calculated from the above relative values of L and C is about 2.1. The degree of overshoot is exponentially related to Q, so if our overshoot is about 29 percent based on a Q of 1.3, their overshoot would be about 47 percent, much more difficult to eliminate. Similarly, the 10-to-90 percent risetime available from a pulse transformer is largely determined by the stray L and C, being about π times the square root of the LC product. For our case, this computes to be about one microsecond, and for the U.S. Pat. No. 4,682,114 transformer it is close to 3.3 µS. This is not an acceptable risetime for most klystron tube loads, so extensive steps would need to be taken to overcome this limitation.

One such step is to make two pulse transformers, each sized for half the power, and connect them in parallel. This reduces the intrinsic risetime as compared to a single larger transformer. However, this is essentially what our transformer design does already; each side of the magnetic core supports a primary and secondary structure that is in fact a half-power pulse transformer in its own night. These are connected in parallel to give the final output, and the risetime is much less than with the U.S. Pat. No. 4,682,114 (single-transformer) design. The transformer of the U.S. Pat. No. 4,682,114 is already about three times the volume of ours; using two such transformers to reduce the risetime makes the volume even larger.

Before leaving this topic, It should be noted that if the pulse transformer of the U.S. Pat. No. 4,682,114 is driven as suggested in their patent with a set of PFN modules, then to obtain a 900-volt drive pulse, their capacitors and switches must withstand at least 1800 volts. Our approach, with a PCC instead of a PFN, allows us to obtain 900 volt pulses with only 970 volts on the capacitors and switches.

A summary of reasons for preferring our design is:

1. The pulse transformer of the U.S. Pat. No. 4,682,114, for the same required output performance, is about three times larger than ours in volume, although comparable in weight.

2. The design of the U.S. Pat. No. 4,682,114 is inherently slower in risetime than ours, by about a factor of 3.3.

3. We have the flexibility to stack two core sets (½-turn primary), or even three (⅓-turn primary) or more to reduce the total number of turns on the transformer secondaries and speed the risetime. Because, in the U.S. Pat. No. 4,682,114, the primaries are wound above the secondaries, they cannot use this strategy and must instead parallel-connect complete transformers if a faster pulse rise is needed. This further adds to the relative size penalty in (1) above.

4. The U.S. Pat. No. 4,682,114 has not shown how to include a "bi-filar" secondary in their transformer to feed cathode heater current to a klystron or magnetron load. Our design takes care of this problem automatically, as we use one of our two parallel secondaries to conduct this current up to the load and the other to return the current to ground while maintaining voltage isolation between the heater supply and the load.

5. The U.S. Pat. No. 4,682,114 does not show how to reset the magnetic core in their transformer system. This is a key problem, as mentioned earlier, and it must be addressed carefully.

Regarding the "reset" problem, consider that 36 separate single-turn primary windings drive the pulse transformer. After each of the ten microsecond long power pulses, a residual current of 18 amperes is left flowing in each primary. The total residual primary current is then 18×36= 648 amperes. To force this current to zero would require a 648 ampere auxiliary power supply, which is large and cumbersome. We have devised a way to do this with a 7 to 9-ampere supply, involving a separate "reset winding" on the transformer. In our design, we use 11-turn reset windings, one on each side of the core, to reset the core using between 7 and 9 amps of DC reset current at about 10 volts.

Without this auxiliary winding, one would need to provide about 600 amps of DC reset current to the primary windings, which is a difficult job. Possible other specific embodiments of our modulator would include a shorter-pulse (4 μS vs. the present 10 μS), higher repetition-rate system (800 Hz. vs. 300 Hz.) to drive pulsed magnetrons or klystrons. This would use the same basic circuit concept, but its compensation circuits would be tailored to the new application. We also envision embodiments for use in the pollution-control and radar industries, which again would use the basic circuit concepts (capacitors, PCCs, IGBTs, pulse transformers with split-core and primary construction) but would make output pulses at different voltages, currents, durations and repetition rates.

Regarding improvements on the modulator concept, the R-L (resistor-inductor) Pulse Compensation Circuit (PCC) could be replaced by either an LC (extremely low loss) network or an active circuit, which would not dissipate power as the present compensation circuit does. The R-L network dissipates about 6 percent of the modulator power at present, which is not a high price to pay for its simplicity and ruggedness.

The embodiments described above are merely given as examples, and it should be understood that the present invention is not limited thereto. It is of course possible to embody the invention in specific forms other than those described without departing from the spirit of the invention. Further modifications and improvements which retain the basic underlying principles disclosed and claimed herein are within the scope and spirit of the invention.

What is claimed is:

1. A power modulator having a pulse generator stage for generating a first electrical pulse, and a step-up pulse transformer connected to said pulse generator stage for receiving said first electrical pulse to produce a second electrical output pulse of higher voltage, said pulse generator stage having:
    a pulse generating section which comprises:
        an energy storage capacitor;
        a pulse switch electronically controllable at turn-on and turn-off, and connected between said energy storage capacitor and said pulse transformer; and
        a passive voltage droop-compensating circuit which connects said pulse switch to said pulse transformer for compensating for a voltage droop during a discharge of said capacitor, thus controlling the shape of the second electrical output pulse,
    said pulse switch being operable to turn on to start said second electrical output pulse by transferring capacitor energy via said voltage droop-compensating circuit to said step-up pulse transformer in the form of said first electrical pulse, and operable to turn off to terminate said second electrical output pulse.

2. Power modulator according to claim 1, wherein said pulse switch is an Insulated Gate Bipolar Transistor switch.

3. Power modulator according to claim 1, wherein said pulse generator stage further comprises a charging power supply connected to said energy storage capacitor for selectively charging said energy storage capacitor, said charging power supply including a series-resonant Insulated Gate Bipolar Transistor inverter.

4. Power modulator according to claim 1, wherein said pulse generator stage further comprises a trigger pulse generator for generating a trigger pulse that triggers said pulse switch.

5. Power modulator according to claim 4 further comprising means for electronically changing the length of said trigger pulse, thus changing the pulse width of said second output pulse.

6. Power modulator according to claim 1, wherein said voltage droop-compensating circuit is a parallel resistor-inductor circuit.

7. A power modulator having a pulse generator stage for generating first electrical pulses, and a step-up pulse transformer connected to said pulse generator stage for receiving said first electrical pulses to produce a second electrical output pulse of higher voltage, said pulse generator stage having:
    a number of pulse generating sections, each of which comprises an energy storage capacitor, a pulse switch electronically controllable at turn-on and turn-off and connected between said energy storage capacitor and said pulse transformer, and a passive voltage droop-compensating circuit which connects said pulse switch to said pulse transformer for compensating for a voltage droop during a discharge of said capacitor,
    said electronically controllable pulse switches of said pulse generating sections being operable to turn on simultaneously to start said second electrical output pulse by transferring capacitor energy via said voltage droop-compensating circuits to said step-up pulse transformer in the form of said first electrical pulses, and operable to turn off simultaneously to terminate said second electrical output pulse.

8. Power modulator according to claim 7, wherein said pulse switches are Insulated Gate Bipolar Transistor switches.

9. Power modulator according to claim 7, wherein said pulse generator stage further comprises a charging power supply connected to said energy storage capacitors for selectively charging said capacitors, said charging power supply including a series-resonant Insulated Gate Bipolar Transistor inverter.

10. Power modulator according to claim 7, wherein each one of said voltage droop-compensating circuits is in the form of a parallel resistor-inductor network.

11. Power modulator according to claim 7, further comprising:
    a trigger pulse generator for generating trigger pulses that trigger said pulse switches, and
    a control circuit for electronically changing the length of said trigger pulses, thus changing the pulse width of said second output pulse.

12. Power modulator according to claim 7, wherein said transformer has a number of primary windings and each one of said primary windings has an independent terminal and a common ground terminal, each one of said primary windings being separately connected through said independent terminal to a respective individual one of said pulse generating sections, thus ensuring equal current flow in said primary windings and said pulse switches.

13. Power modulator according to claim 7, wherein said transformer has a number of primary windings and each one of said primary windings surrounds only a portion of the total magnetic core cross-section of said transformer.

14. Power modulator according 7, wherein said transformer includes a secondary winding, a number of primary windings and at least two cores stacked up next to each other, each core being surrounded by a respective set of said primary windings, generally distributed equally among said cores, and said secondary winding being wound around said cores such that said primary windings are within said secondary winding, wherein each one of said primary windings surrounds only a portion of the total magnetic core cross-section of said transformer to give an effect of a fractional-turn primary winding.

15. Power modulator according to claim 14, wherein said transformer includes a further secondary winding and each one of said cores has two legs with a respective one of said secondary windings around each of the two legs.

16. Power modulator according to claim 15, wherein said transformer is of the open-frame type.

17. Power modulator according to claim 7, wherein said transformer has secondary windings connected to any one of a Klystron, a magnetron, a traveling wave tube and a cross field amplifier.

18. A power modulator provided with a step-up transformer for receiving first electrical pulses generated by a number of pulse generating sections in a pulse generator and for producing second higher voltage electrical pulses, said step-up transformer having at least one secondary winding, primary windings for receiving said first pulses and a core having at least two core sections, each core section being surrounded by a respective set of said primary windings, generally distributed equally among said core sections, and said secondary winding being wound around said core sections such that said primary windings are within said secondary winding, wherein:

each one of said primary windings surrounds only a portion of the total magnetic core cross-section of said transformer to give an effect of a fractional-turn primary winding; and each one of said primary windings is separately connected to a respective individual one of said pulse generating sections, in operation, at least one primary winding, on each one of the core sections, is driven such that each core section contains flux to induce a correct voltage in said secondary winding.

19. Power modulator according to claim 18, wherein said transformer includes two secondary windings, and each one of said core sections has two legs with a respective one of said secondary windings around each of the two legs.

20. Power modulator according to claim 18, wherein said step-up transformer is of the non-enclosed type, and said core comprises two identical core sections, half of said primary windings being wound around the first of said core sections and the remaining primary windings being wound around the other core section.

21. A power modulator having a pulse generator stage for generating first electrical pulses, and a step-up pulse transformer connected to said pulse generator stage for receiving said first electrical pulses to produce a second electrical output pulse of higher voltage, said pulse generator stage having a number of pulse generating sections, wherein:

each one of said pulse generating sections comprises an energy storage capacitor, an Insulated Gate Bipolar Transistor (IGBT) pulse switch electronically controllable at turn-on and turn-off and connected between said energy storage capacitor and said pulse transformer, said pulse transformer has a number of primary windings, each of which is separately connected to a respective individual one of said pulse generating sections, and said electronically controllable IGBT pulse switches of said pulse generating sections are operable to turn on simultaneously to start said second electrical output pulse by transferring capacitor energy to said primary windings of said step-up pulse transformer in the form of said first electrical pulses, and operable to turn off simultaneously to terminate said second electrical output pulse.

22. Power modulator according to claim 21, wherein said pulse generator stage further comprises a charging power supply connected to said energy storage capacitors for selectively charging said capacitors, said charging power supply including a series-resonant Insulated Gate Bipolar Transistor inverter.

23. A power modulator having a pulse generator stage for generating a first electrical pulse, and a step-up pulse transformer connected to said pulse generator stage for receiving said first electrical pulse to produce a second electrical output pulse of higher voltage, said pulse generator stage having:

a pulse generating section which comprises:

an energy storage capacitor;

a charging power supply, in the form of a series-resonant Insulated Gate Bipolar Transistor inverter, connected to said energy storage capacitor for selectively charging said energy storage capacitor an Insulated Gate Bipolar Transistor pulse switch electronically controllable at turn-on and turn-off and connected between said energy storage capacitor and said pulse transformer, said pulse switch being operable to turn on to start said second electrical output pulse by transferring capacitor energy to said pulse transformer in the form of said first electrical pulse, and operable to turn off to terminate said second electrical output pulse.

* * * * *